(12) United States Patent  
Cheng et al.

(10) Patent No.: US 11,417,729 B2  
(45) Date of Patent: Aug. 16, 2022

(54) TRANSISTORS WITH CHANNELS FORMED OF LOW-DIMENSIONAL MATERIALS AND METHOD FORMING SAME

(71) Applicant: Taiwan Semiconductor Manufacturing Company, Ltd., Hsinchu (TW)

(72) Inventors: Chao-Ching Cheng, Hsinchu (TW); Tzu-Ang Chao, Hsinchu (TW); Chun-Chieh Lu, Taipei (TW); Hung-Li Chiang, Taipei (TW); Tzu-Chiang Chen, Hsinchu (TW); Lain-Jong Li, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 49 days.

(21) Appl. No.: 16/837,261

(22) Filed: Apr. 1, 2020

(65) Prior Publication Data

US 2021/0066627 A1 Mar. 4, 2021

Related U.S. Application Data

(60) Provisional application No. 62/893,233, filed on Aug. 29, 2019.

(51) Int. Cl.
*H01L 29/06* (2006.01)  
*H01L 51/05* (2006.01)  
(Continued)

(52) U.S. Cl.  
CPC ...... *H01L 29/0673* (2013.01); *H01L 21/0262* (2013.01); *H01L 21/02568* (2013.01);  
(Continued)

(58) Field of Classification Search  
CPC ......... H01L 21/02518; H01L 21/02527; H01L 21/02568; H01L 21/02603;  
(Continued)

(56) References Cited

U.S. PATENT DOCUMENTS 8,349,404 B2 1/2013 Resasco et al.  
8,637,374 B2 1/2014 Appenzeller et al.  
(Continued)

FOREIGN PATENT DOCUMENTS

EP 2120274 A2 11/2009  
KR 20040086474 A 10/2004  
(Continued)

OTHER PUBLICATIONS

Al-Hilli, et al., "The Preparation and Properties of Transition Metal Dichalcogenide Single Crystals," Journal of Crystal Growth, vol. 15, Dec. 1971, pp. 93-101.  
(Continued)

*Primary Examiner* — Cheung Lee  
(74) *Attorney, Agent, or Firm* — Slater Matsil, LLP

(57) ABSTRACT

A method includes forming a first low-dimensional layer over an isolation layer, forming a first insulator over the first low-dimensional layer, forming a second low-dimensional layer over the first insulator, forming a second insulator over the second low-dimensional layer, and patterning the first low-dimensional layer, the first insulator, the second low-dimensional layer, and the second insulator into a protruding fin. Remaining portions of the first low-dimensional layer, the first insulator, the second low-dimensional layer, and the second insulator form a first low-dimensional strip, a first insulator strip, a second low-dimensional strip, and a second insulator strip, respectively. A transistor is then formed based on the protruding fin.

20 Claims, 21 Drawing Sheets

(51) Int. Cl.
   *H01L 51/00* (2006.01)
   *H01L 21/02* (2006.01)
   *H01L 29/786* (2006.01)
   *H01L 29/66* (2006.01)
   *H01L 29/24* (2006.01)
   *H01L 29/423* (2006.01)

(52) U.S. Cl.
   CPC ........ *H01L 21/02603* (2013.01); *H01L 29/24* (2013.01); *H01L 29/42392* (2013.01); *H01L 29/66969* (2013.01); *H01L 29/78696* (2013.01); *H01L 51/0003* (2013.01); *H01L 51/0048* (2013.01); *H01L 51/0541* (2013.01); *H01L 51/0558* (2013.01)

(58) Field of Classification Search
   CPC ........... H01L 21/02606; H01L 21/0262; H01L 21/823412; H01L 21/823431; H01L 21/823462; H01L 21/823487; H01L 27/085; H01L 27/0886; H01L 27/0924; H01L 29/0669; H01L 29/0673; H01L 29/24; H01L 29/42316; H01L 29/4232; H01L 29/42384; H01L 29/42392; H01L 29/66969; H01L 29/786; H01L 29/78642; H01L 29/48696; H01L 51/0003; H01L 51/0048; H01L 51/0512; H01L 51/0541; H01L 51/0558
   See application file for complete search history.

(56) References Cited

U.S. PATENT DOCUMENTS

| | | | |
|---|---|---|---|
| 9,892,912 B2 | 2/2018 | Yin et al. | |
| 2009/0297732 A1* | 12/2009 | Jiang | B82Y 40/00 427/585 |
| 2010/0108982 A1* | 5/2010 | Ping | H01L 45/1616 257/5 |
| 2013/0130446 A1* | 5/2013 | Cao | B82Y 10/00 438/151 |
| 2017/0170267 A1 | 6/2017 | Rosenblatt et al. | |
| 2018/0114727 A1* | 4/2018 | Rodder | H01L 21/823807 |
| 2018/0315838 A1 | 11/2018 | Morrow et al. | |
| 2019/0097147 A1 | 3/2019 | Lu et al. | |
| 2019/0181367 A1 | 6/2019 | Farmer et al. | |
| 2020/0091287 A1* | 3/2020 | Glass | H01L 29/78696 |
| 2020/0105751 A1* | 4/2020 | Dewey | B82Y 10/00 |

FOREIGN PATENT DOCUMENTS

| | | |
|---|---|---|
| KR | 20080094884 A | 10/2008 |
| KR | 20160101213 A | 8/2016 |
| TW | 201836970 A | 10/2018 |
| TW | 201905989 A | 2/2019 |
| WO | 2013095651 A1 | 6/2013 |

OTHER PUBLICATIONS

Brixner, L.H., "Preparation and Properties of the Single Crystalline AB2-Type Selenides and Tellurides of Niobium, Tantalum, Molybdenum and Tungsten," Journal of Inorganix and Nuclear Chemistry, vol. 24, Issue 3, Mar. 1962, pp. 257-263.
Brixner, L.H., "X-ray Study and Thermoelectric Properties of the WxTa1xSe2 System," Journal of the Electrochemical Society, vol. 110, No. 4, Apr. 1963, pp. 289-293.
Glemser, et al., "About tungsten sulfides and tungsten selenide," Journal of Inorganic Chemistry, vol. 257, Dec. 1948, pp. 241-246.
Hicks, W.T., "Semiconducting Behavior of Substituted Tungsten Diselenide and it's Analogues," Journal of the Electrochemical Society, vol. 111, No. 9, Sep. 1964, pp. 1058-1065.
Huang, et al., "Large-Area Synthesis of Highly Crystalline WSe2 Monolayers and Device Applications," ACS Nano, vol. 8, No. 1, Dec. 14, 2013, pp. 923-930.
Shulaker, et al., "Linear Increases in Carbon Nanotube Density Through Multiple Transfer Technique," NANO Letters, vol. 11, Apr. 6, 2011, pp. 1881-1886.
Tsirlina, et al., "Synthesis and characterization of inorganic fullerene-like WSe2 material," Fullerene Science and Technology, vol. 6, No. 1, Apr. 23, 1198, pp. 157-165.
Zhou et al., "Printed thin-film transistors an NO2 gas sensors based on sorted semiconducting carbon nanotubes by isoindigo-based copolyner," Carbon, vol. 108, Nov. 2016, pp. 372-380.
Thathachary, et al., "Indium Arsenide (InAs) Single and Dual Quantum-Well Heterostructure FinFETs," 2015 Symposium on VLSI Technology, Kyoto, Japan, Jun. 16, 2015-Jun. 18, 2015, 2 pages.

* cited by examiner

TRANSISTORS WITH CHANNELS FORMED OF LOW-DIMENSIONAL MATERIALS AND METHOD FORMING SAME

PRIORITY CLAIM AND CROSS-REFERENCE

This application claims the benefit of U.S. Provisional Application No. 62/893,233, filed Aug. 29, 2019, and entitled "Transistors with channels formed of low-dimensional materials and method forming same;" which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semi-conductive layers of material over a semiconductor substrate, and patterning the various material layers using lithography to form circuit components and elements thereon.

Transistors are circuit components or elements that are often formed on semiconductor devices. Many transistors may be formed on a semiconductor substrate in addition to capacitors, inductors, resistors, diodes, conductive lines, or other elements, depending on the circuit design.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
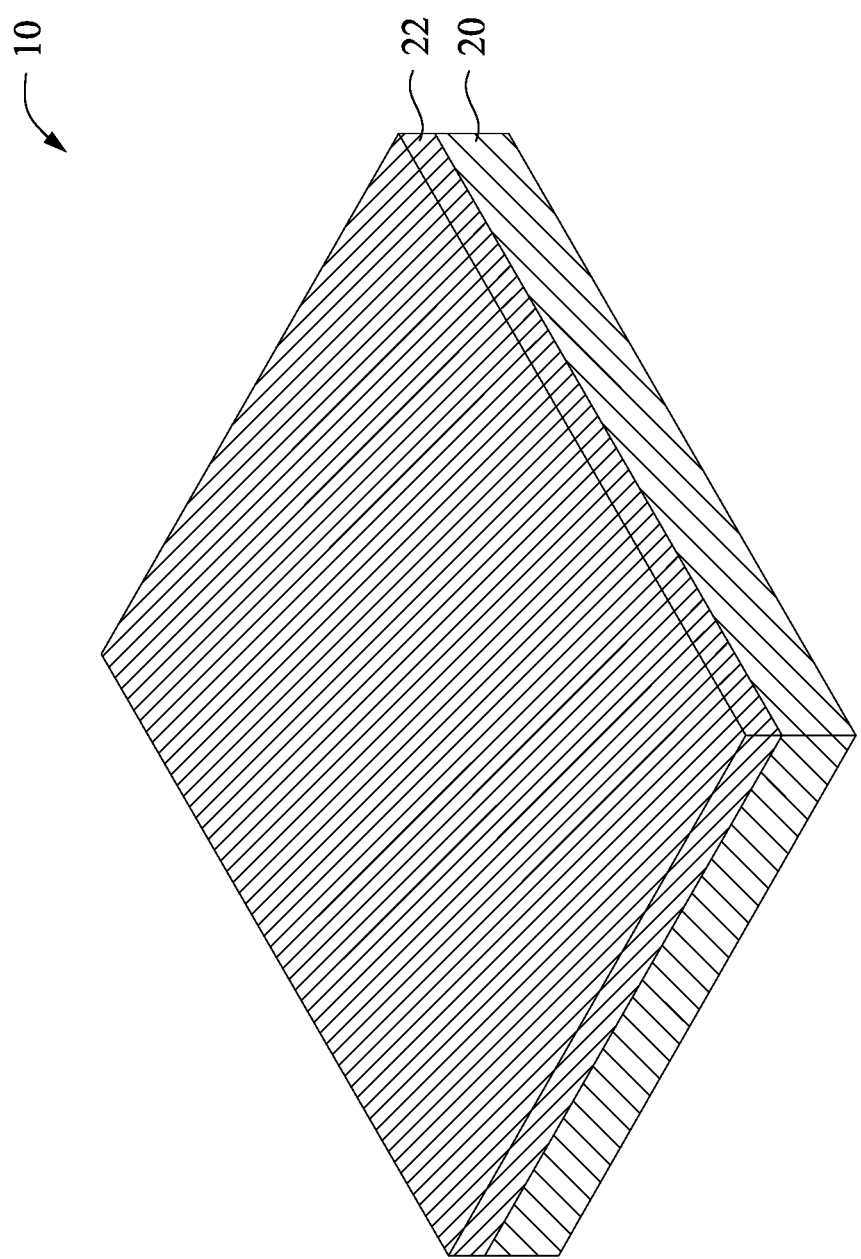
FIGS. 1-5, 6A, 6B, 6C, 7A, 7B, 8, 9A, and 9B illustrate the perspective views and cross-sectional views of intermediate stages in the formation of transistors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistors having low-dimensional channels and the method of forming the same are provided in accordance with some embodiments. The intermediate stages in the formation of the transistors are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In accordance with some embodiments of the present disclosure, a plurality of layers of low-dimensional materials are formed. A plurality of insulators are formed to separate the plurality of layers of low-dimensional materials. The low-dimensional material layers may include carbon nanotube networks, aligned carbon nanotubes, semiconductor-like two-dimensional (2D) materials such as Transition Metal Dichalcogenides (TMDs), or the like. The low-dimensional materials and the insulators are stacked and patterned as a fin that protrudes over an isolation layer. Fin Field-Effect Transistors (FinFET) or Gate-All-Around (GAA) transistors may be formed based on the protruding fin.

FIGS. 1-5, 6A, 6B, 6C, 7A, 7B, 8, 9A, and 9B illustrate the perspective views and cross-sectional views of intermediate stages in the formation of transistors in accordance with some embodiments of the present disclosure. The corresponding processes are also reflected schematically in the process flow shown in FIG. 16.

In FIG. 1, wafer 10, which includes substrate 20, is provided. The substrate 20 may be a semiconductor substrate, such as a bulk semiconductor substrate, a Semiconductor-On-Insulator (SOI) substrate, or the like. Substrate 20 may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, SiC, GaAsP, AlInAs, AlGaAs, GaInAs, GaInP, and/or GaInAsP; or combinations thereof. Substrate 20 may also be formed of other materials such as sapphire, Indium tin oxide (ITO), or the like.

Figure 16:
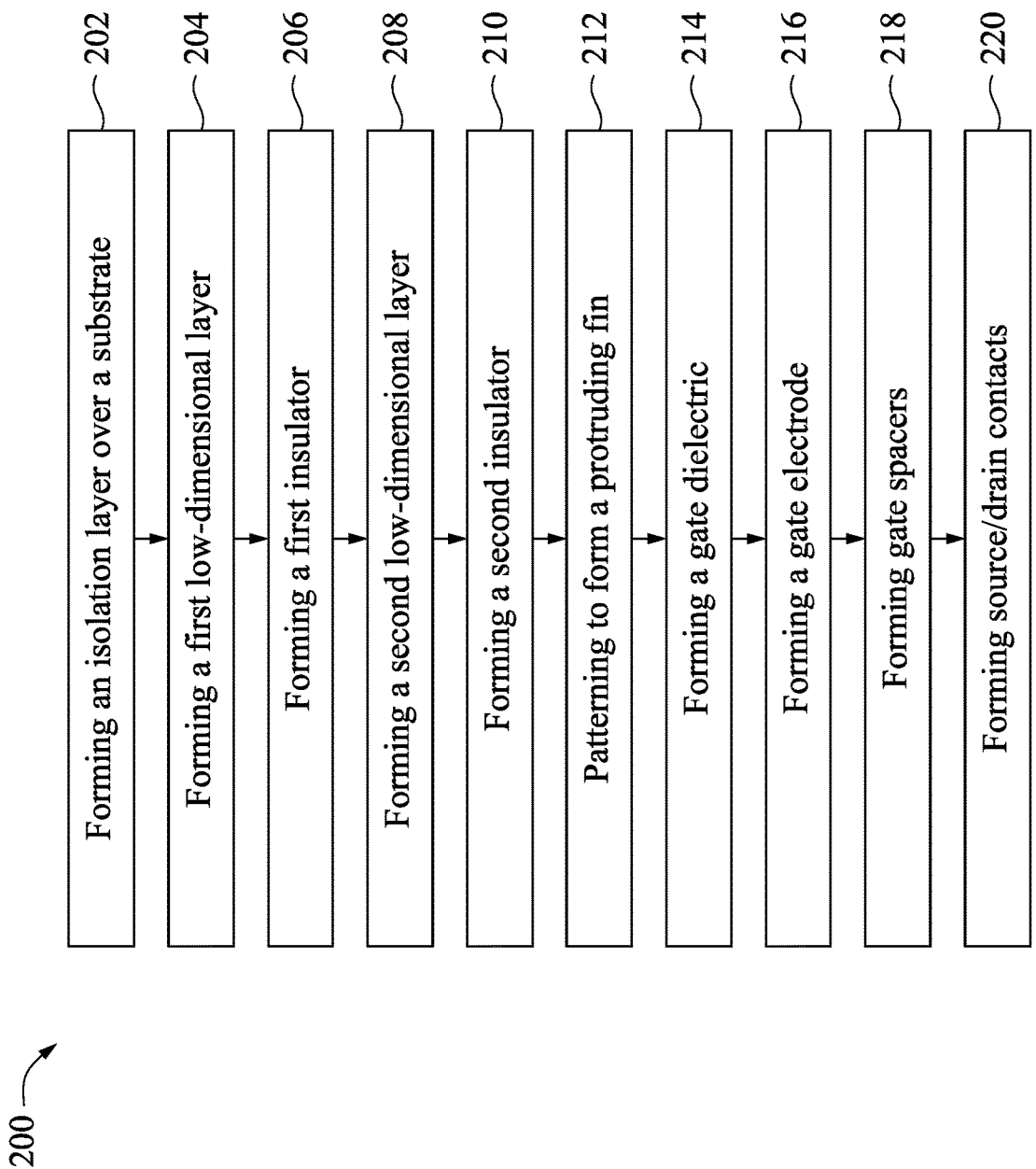
FIG. 16 illustrates a process flow for forming a transistor in accordance with some embodiments.

Isolation layer 22 is formed over substrate 20. The respective process is illustrated as process 202 in the process flow 200 as shown in FIG. 16. In accordance with some embodiments, isolation layer 22 is in physical contact with substrate 20. In accordance with alternative embodiments, between isolation layer 22 and substrate 20, there may be other layers and devices including, and not limited to, dielectric layers, metal features, or the like. For example, there may be inter-layer dielectrics, inter-metal dielectrics (which may include low-k dielectric layers), and/or the like. There may be, or may not be, integrated circuit devices such as passive devices (capacitors, resistors, inductors, or the like) and/or active devices (transistors, diodes, or the like) formed between isolation layer 22 and substrate 20.

In accordance with some embodiments of the present disclosure, isolation layer 22 is formed of or comprises an oxide such as silicon oxide, a nitride such as silicon nitride, hexagonal Boron Nitride (hBN), a high-k dielectric material such as aluminum oxide, hafnium oxide, zirconium oxide, lanthanum oxide, or the like. Isolation layer 22 may be a crystalline layer (single crystalline or polycrystalline) or an amorphous layer. Isolation layer 22 may have a single-layer structure or a composite structure including a plurality of layers. For example, isolation layer 22 may include a bi-layer structure, a tri-layer structure, or the like. The bi-layer structure may include two layers formed of different materials, for example, a silicon oxide layer and a silicon nitride layer over the silicon oxide layer. The tri-layer structure may include three layers formed of different materials, for example, a $SiO_2/SiN/SiO_2$ structure, a $HfO_2/SiO_2/HfO_2$ structure, or the like.

The formation process of isolation layer 22 may include one or a plurality of deposition process(es) including, for example, a Plasma Enhanced Chemical Vapor Deposition (PECVD) process, an Atomic Layer Deposition (ALD) process, a Chemical Vapor Deposition (CVD) process, or the like. In accordance with some embodiments, isolation layer 22 may also be formed through thermal oxidation, chemical oxidation, or the like, for example, when isolation layer 22 comprises silicon oxide. Isolation layer 22 may also be formed through transferring. For example, when isolation layer 22 comprises hBN, the hBN layer may be formed on another substrate such as a sapphire substrate, a copper substrate, or the like, and then transferred onto substrate 20. The thickness of isolation layer 22 may be greater than about 0.5 nm, and may be in the range between about 0.5 nm and about 15 nm in accordance with some embodiments.

Figure 2:
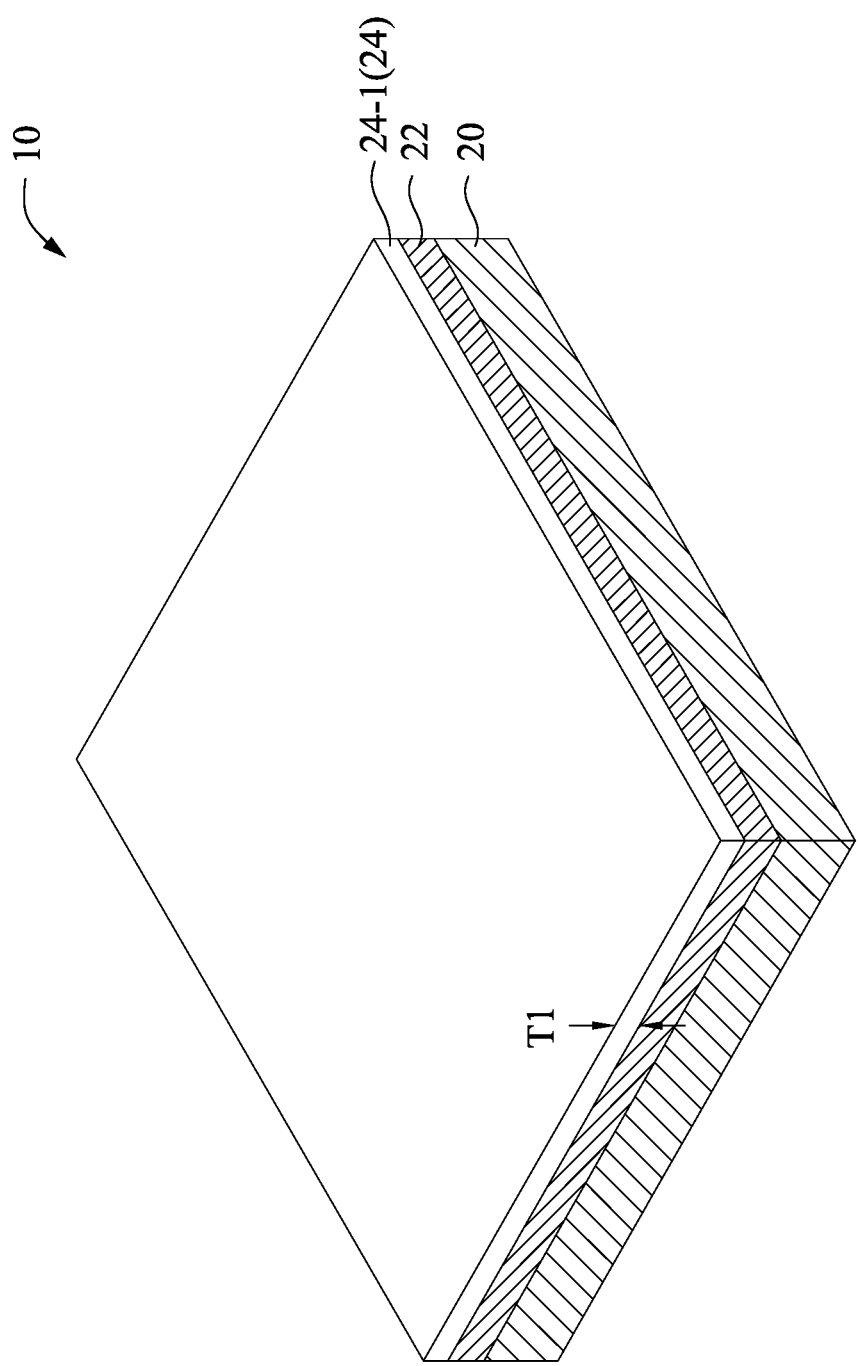

Referring to FIG. 2, a first low-dimensional layer 24-1 (also referred to as 24) is formed. The respective process is illustrated as process 204 in the process flow 200 as shown in FIG. 16. Throughout the description, the term "low-dimensional" refers to the layers whose thicknesses are small, for example, smaller than about 10 nm, smaller than about 5 nm, or smaller than about 1 nm. In accordance with some embodiments of the present disclosure, low-dimensional layer 24-1 has a thickness T1 smaller than about 5.0 nm, and thickness T1 may be in the range between about 0.5 nm and about 5.0 nm.

Figure 13:
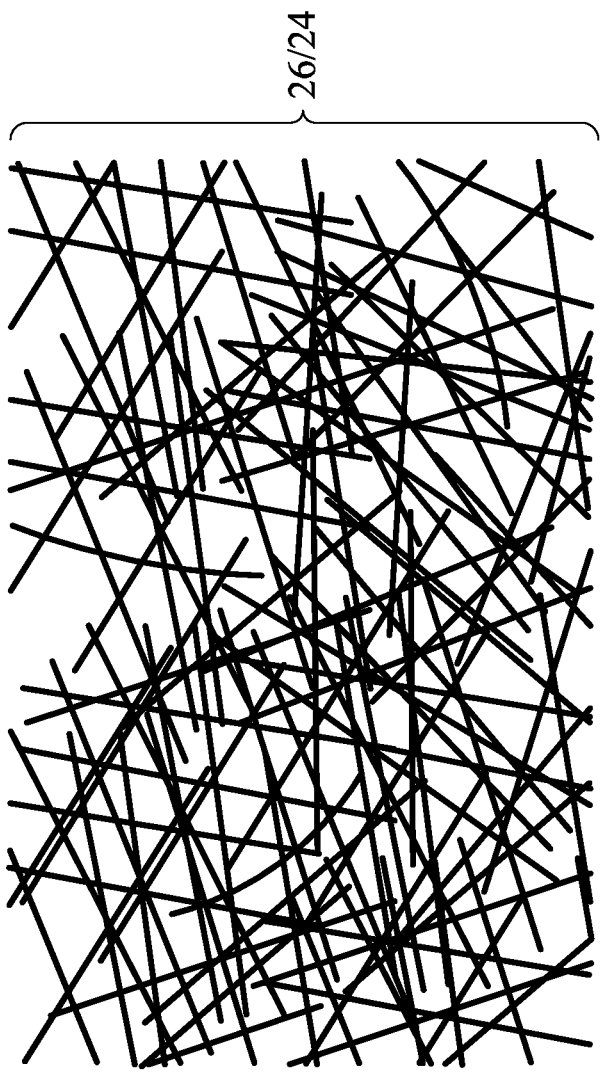
FIG. 13 illustrates the schematic plane view of carbon nanotube networks in accordance with some embodiments.

In accordance with some embodiments of the present disclosure, low-dimensional layer 24-1 comprises a carbon nanotube network, which includes carbon nanotubes connected together as a network. In a plane view, the carbon nanotube network may look like a plurality of straight (or slightly curved) tubes (with different lengths) placed randomly. For example, FIG. 13 schematically illustrates a plane view of a carbon nanotube network in accordance with some embodiments, which includes a plurality of carbon nanotubes 26, which are physically and electrically interconnected. The interconnected network thus functions as a layer with the properties of a semiconductor layer. Low-dimensional layer 24-1 may include one layer or several layers of carbon nanotubes. Although in the macro view, low-dimensional layer 24-1 form a blanket layer, in a micro view, the carbon nanotubes in low-dimensional layer 24-1 have spaces between the carbon nanotubes.

In accordance with some embodiments of the present disclosure, low-dimensional layer 24-1 (when formed of the carbon nanotube network) includes semiconducting carbon Single-Wall Carbon NanoTubes (sc-SWCNTs), which are formed through an immersion process. During the immersion process, wafer 10 is immersed into an immersion solution, so that low-dimensional layer 24-1 is grown on isolation layer 22. An example preparation process of the immersion solution is as follows, with some example weights and volumes mentioned. It is to be appreciated that the weights and volumes mentioned herein may be increased proportionally when more immersion solution is to be prepared. Firstly, about 8 mg to 12 mg arc discharge SWCNTs and about 3 mg to about 7 mg isoindigo-based poly (9, 9-dioctylfluorene) (PFO) derivative (PFIID) are dispersed in 10 mL toluene. The mixture then goes through probe-ultrasonication for about 20 minutes to about 40 minutes. The resulting solution is then centrifuged, for example, for about 0.5 hours to about 1.5 hours, so that metallic species and large bundles of SWCNTs are removed. The supernatant in the solution is drawn out using a syringe. The solution is then diluted with about 70 mL to 90 mL toluene, and the resulting solution further goes through probe-ultrasonication, for, for example, 8 minutes to about 12 minutes. The immersion solution is thus ready for the immersion process.

Wafer 10 is then prepared, for example, through an oxygen-based pre-treatment process. The pre-treatment process may be performed using the plasma of $O_2$, or through an ozone treatment, so that the surface of isolation layer 22 is treated, and the carbon nanotube network is able to grow thereon. The immersion process is then performed. The immersion duration may be in the range between about 20 hours and 28 hours. In the immersion process, the temperature of the immersion solution may be around room temperature, for example, in the range between about 20° C. and 25° C. In the immersion process, the carbon nanotubes, which may be SWCNTs, are grown on isolation layer 22. After the immersion process, wafer 10 is rinsed in a cleaning solution such as toluene, followed by a purging process, for example, using nitrogen ($N_2$) to remove residue polymer. Wafer 10 may then be baked to remove toluene, for example, at a temperature in the range between about 100° C. and about 130° C., for a period of time between about 20 minutes and about 40 minutes. In accordance with some embodiments, low-dimensional layer 24-1 is formed on the entire wafer 10. The resulting carbon nanotube network is illustrated in FIG. 13 as an example.

Figure 10A:
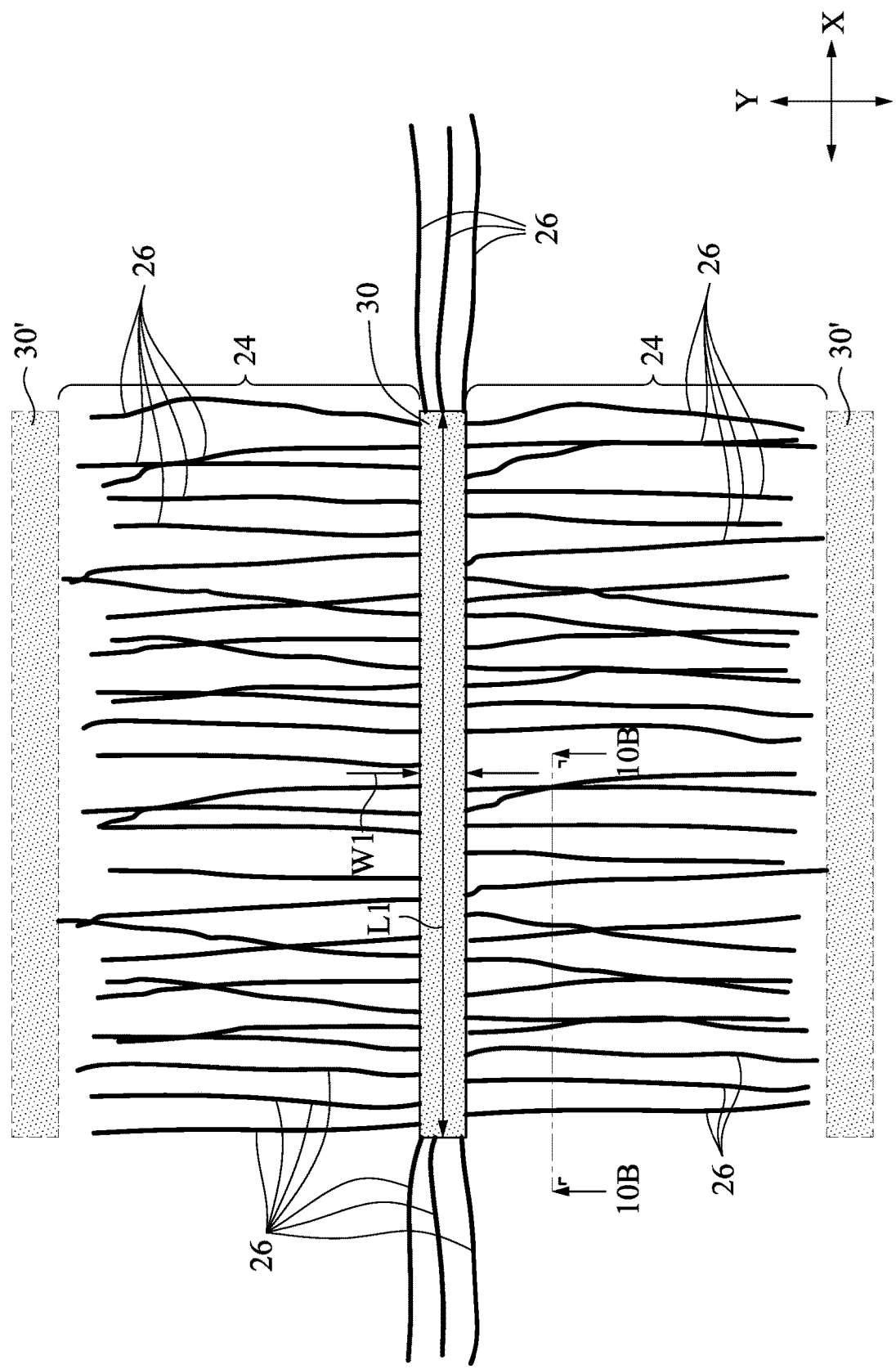
FIG. 10A illustrates a plane view in the formation of aligned carbon nanotubes from a catalyst strip in accordance with some embodiments.

In accordance with alternative embodiments, as shown in FIG. 10A, aligned carbon nanotubes 26 are formed, which have lengthwise directions generally aligned in the same direction (Y-direction as in FIG. 10A). The aligned carbon nanotubes 26 are collectively referred to as low-dimensional layer 24-1. Depending on the formation process, aligned carbon nanotubes 26 may be close to each other (and are much denser than illustrated) or may be spaced apart further from each other than illustrated. There may be a single layer of aligned carbon nanotubes 26, or there may be several layers of aligned carbon nanotubes 26, as shown in FIG. 10B.

Figure 10B:
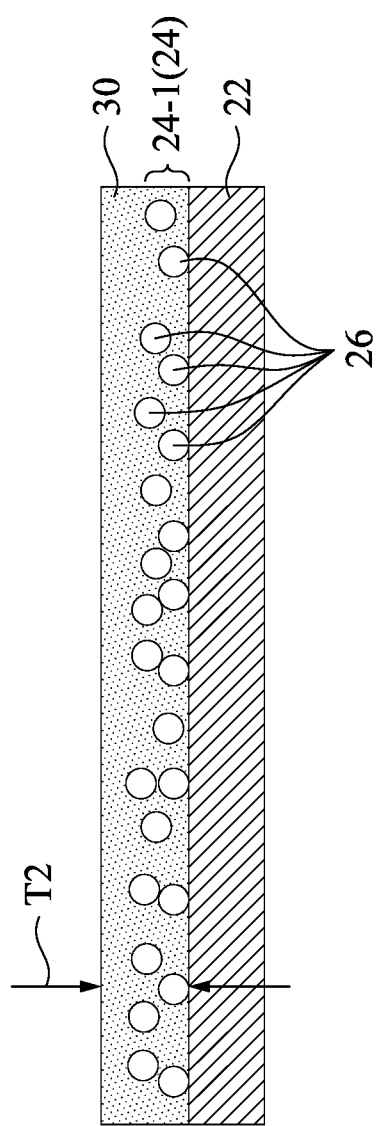
FIG. 10B illustrates a cross-sectional view of the aligned carbon nanotubes and the catalyst strip in accordance with some embodiments.

FIGS. 10A and 10B illustrate a plane view and a cross-sectional view of aligned carbon nanotubes 26 in accordance with some embodiments. To form the aligned carbon nanotubes, catalyst strip 30 is first formed in accordance with some embodiments. Catalyst strip 30 may be formed of a metal of iron, nickel, copper, molybdenum, tungsten, or the like, and may be formed of pure or substantially pure aforementioned metal, for example, with the metal atomic percentage being higher than about 95 percent. The formation of catalyst strip 30 may include a lift-off process, which may include forming and patterning a sacrificial layer (not shown), and depositing the metal layer. The sacrificial layer has trenches therein to reveal the underlying isolation layer. Some portions of the metal layer are formed over the patterned sacrificial layer, and some other portions are formed directly on isolation layer 22 through the trenches in the sacrificial layer. The sacrificial layer is then removed along with the portions of the metal layer formed thereon (hence the name lift-off). The portions of the metal layer on isolation layer 22 remain. Alternatively, the formation of catalyst strip 30 may include a deposition process to deposit a blanket metal layer, followed by patterning the metal layer. The deposition process may include a Physical Vapor Deposition (PVD) process, a Chemical Vapor Deposition (CVD) process, or the like. The blanket metal layer is then patterned using a photo lithography process to form the catalyst strip 30. An example catalyst strip 30 is shown in FIGS. 10A and 10B. As shown in FIG. 10A, catalyst strip 30 may be an elongated strip, which is formed adjacent to where aligned carbon nanotubes 26 are to be formed. The width W1 of catalyst strip 30 may be smaller than about 10 μm, and may be in the range between about 1 μm and about 10 μm. The length L1 of catalyst strip 30 is determined based on the size and the location of the regions for forming transistors, and may be in the range between about 100 μm and about 1,000 μm in accordance with some embodiments, for example.

Referring to FIG. 10B, a cross-sectional view of catalyst strip 30 is shown. The cross-sectional view is obtained from the reference cross-section 10B-10B as in FIG. 10A. The thickness T2 of catalyst strip 30 is small enough in order to maintain the low-dimension property of the aligned carbon nanotubes 26, and thickness T2 may be equal to or smaller than the desirable thickness of the low-dimensional layer 24-1. In accordance with some embodiments, thickness T2 is in the range between about 0.2 nm and about 1 nm.

The aligned carbon nanotubes 26 are grown using a carbon-containing precursor such as $CH_4$, $C_2H_6O$, $C_3H_8O$, combinations thereof, or the like. The temperature of wafer 10 may be in the range between about 600° C. and about 1,000° C., so that the precursor decomposes, and carbon is grown starting from catalyst strip 30 to form the aligned carbon nanotubes 26. In accordance with some embodiments of the present disclosure, during the growth of aligned carbon nanotubes 26, the pressure of the precursor may be in the range between about 1 Torr and about 760 Torr. The duration for the growing process may be in the range between about 30 minutes and about 300 minutes. The carrier gas may be the mixed gas of $H_2$ mixed with $N_2$ or Ar. The ratio of the flow rate of $H_2$ to the flow rate of $N_2$ may be in the range between about 0.05 and about 0.08. The ratio of the flow rate of $H_2$ to the flow rate of Ar may be in the range between about 0.05 and about 0.08.

As shown in FIG. 10A, the aligned carbon nanotubes 26 are grown from catalyst strip 30, which is used as the catalyst for the reaction for forming the aligned carbon nanotubes 26. The growth is aligned to the crystalline direction of the underlying isolation layer 22 due to Van der waals force. For example, the aligned carbon nanotubes 26 may be grown in [100] direction when the surface plane of the underlying isolation layer 22 is a (111) plane. The growth of the aligned carbon nanotubes 26 is generally in the direction perpendicular to the sidewall of catalyst strip 30, and parallel to the top surface of isolation layer 22. For example, as shown in FIG. 10A, the long sidewalls of catalyst strip 30 are in the X-direction, and the aligned carbon nanotubes 26 are grown in the Y-direction. It is appreciated that the aligned carbon nanotubes 26, during the cause of growth, may deviate slightly from the Y-direction. This causes the aligned carbon nanotubes 26 to be generally, but not completely straight. The deviation may also cause a small portion of neighboring aligned carbon nanotubes 26 to cross with each other. The neighboring aligned carbon nanotubes 26 may be spaced apart from each other, or may be in contact with each other. In accordance with some embodiments of the present disclosure, the diameter of the aligned carbon nanotubes 26 may be in the range between about 0.5 nm and about 1 nm. There may be a single layer of the aligned carbon nanotubes 26 formed. There may also be two or more layers of the aligned carbon nanotubes 26 formed, depending on the process condition for forming the aligned carbon nanotubes 26.

In accordance with some embodiments of the present disclosure, the aligned carbon nanotubes 26 in a device region are grown from a single catalyst strip 30. In accordance with alternative embodiments, the aligned carbon nanotubes 26 in a device region are grown from two catalyst strips 30, which are located close to each other, and parallel to each other. For example, FIG. 10A illustrates catalyst strips 30' using dashed lines, with catalyst strips 30' being parallel to catalyst strip 30. Accordingly, when the aligned carbon nanotubes 26 are grown from catalyst strip 30, there are also aligned carbon nanotubes 26 (not shown) grown from catalyst strips 30'. The aligned carbon nanotubes 26 growing from catalyst strips 30' extend toward catalyst strips 30, and the aligned carbon nanotubes 26 growing from catalyst strips 30 extend toward catalyst strips 30'. Accordingly, in the device region between catalyst strip 30 and the neighboring catalyst strips 30', the low-dimensional layer 24-1 include the aligned carbon nanotubes 26 grown from both of catalyst strip 30 and 30'. This scheme results in the density of the aligned carbon nanotubes 26 to be doubled without increasing the growth time.

Figure 6A:
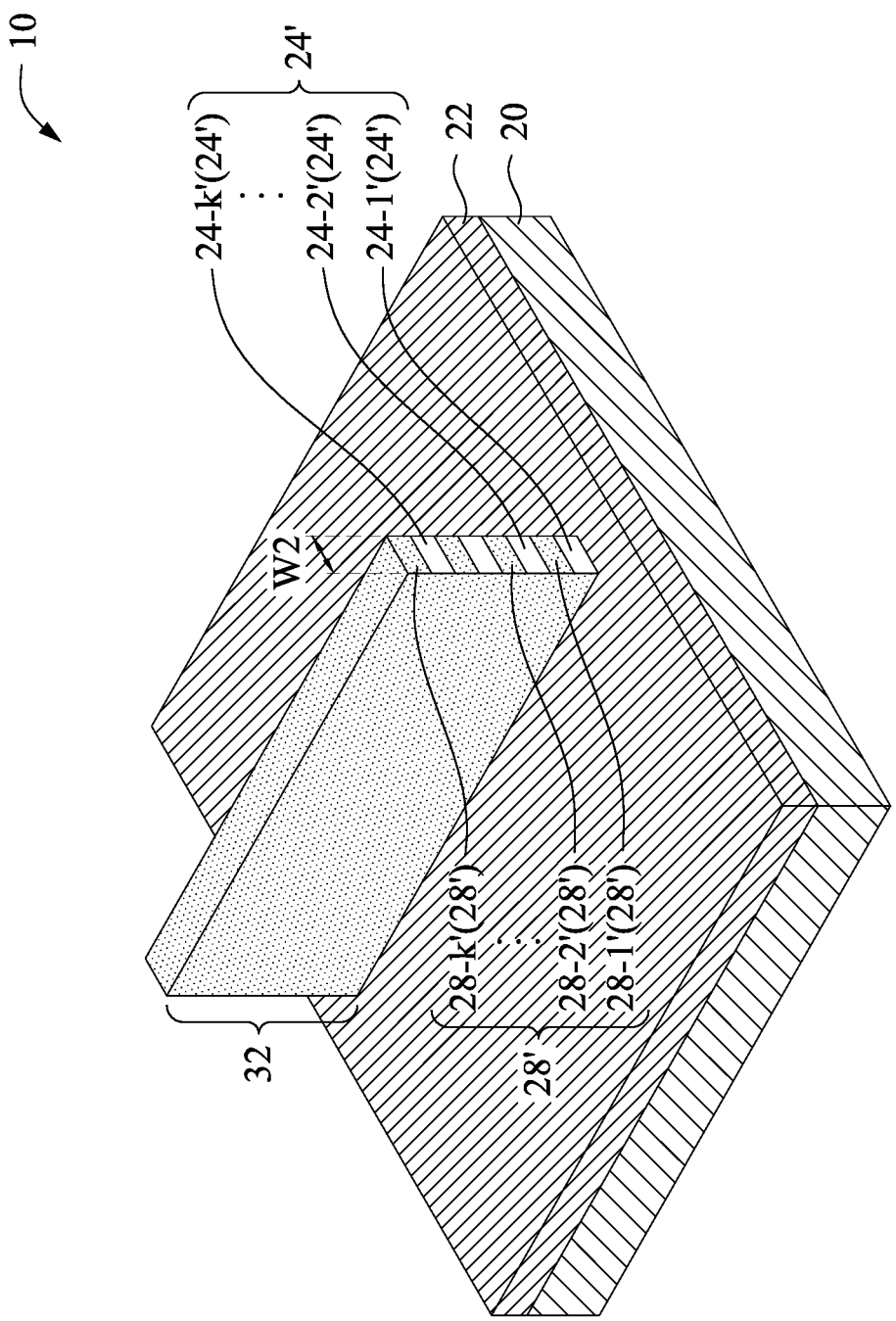
Figure 6B:
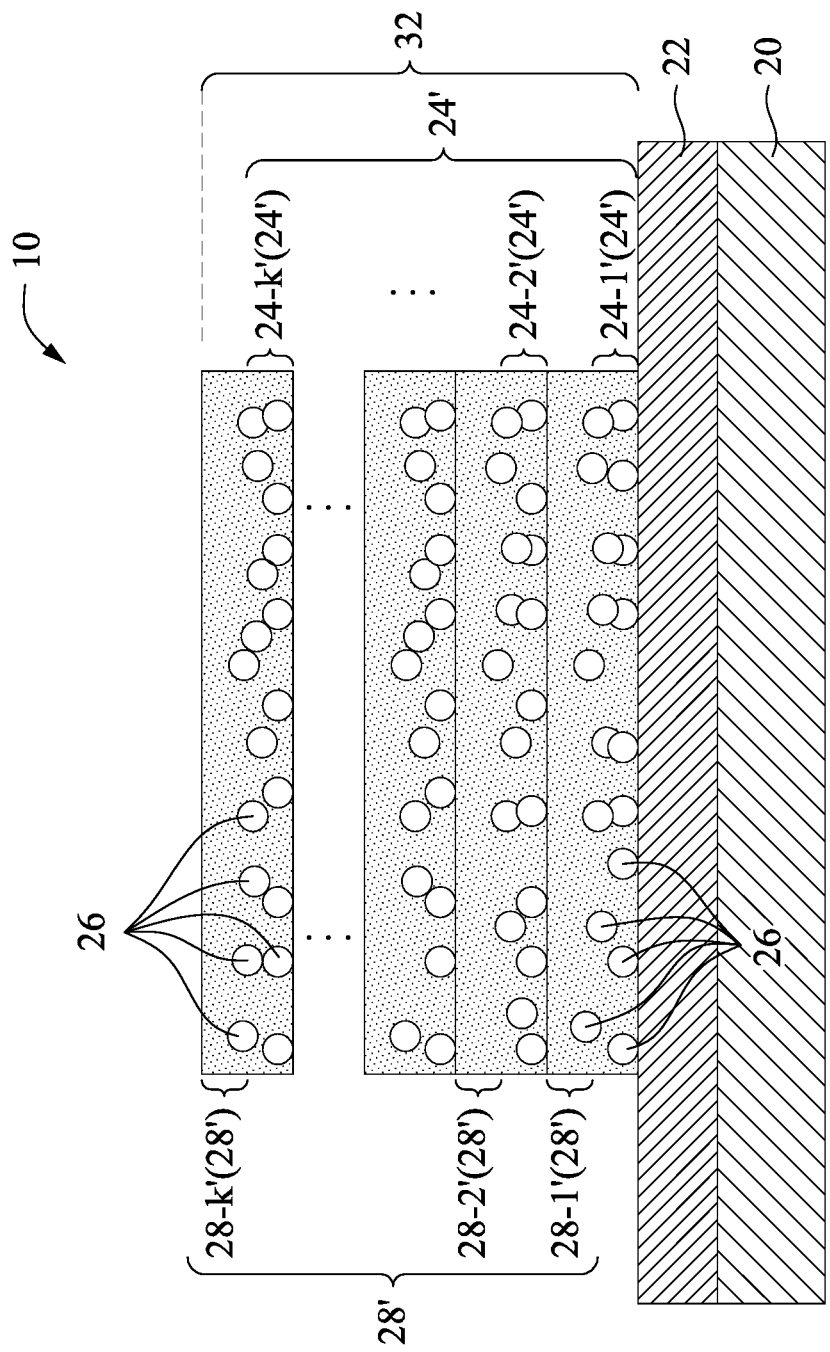

In accordance with some embodiments, after the growth of the aligned carbon nanotubes 26, the catalyst strip 30 is removed in an etching process, which may be a wet etching process or a dry etching process. In accordance with alternative embodiments, instead of removing catalyst strip 30 at this time, catalyst strip 30 (and 30', if formed) is removed in a subsequent process as shown in FIGS. 6A and 6B. Accordingly, the subsequently formed insulator 28-1 (FIG. 3) covers and contacts catalyst strip 30.

Referring back to FIG. 2, in accordance with yet other embodiments of the present disclosure, low-dimension layer 24-1 comprises a Transition Metal Dichalcogenide (TMD) layer. The TMD layer comprises the compound of a transition metal and a group-VIA element. The transition metal may include W, Mo, Ti, V, Co, Ni, Zr, Tc, Rh, Pd, Hf, Ta, Re, Ir, Pt, or the like. The group-VIA element may be sulfur (S), selenium (Se), tellurium (Te), or the like. For example, the TMD layer may include $MoS_2$, $MoSe_2$, $WS_2$, $WSe_2$, or the like.

The TMD layer may be a mono-layer or may include a few mono-layers. In accordance with some embodiments, the transition metal atoms form a layer in the middle, and the group-VIA atoms form a first layer underlying the layer of transition metal atoms, and a second layer over the layer of transition metal atoms. The transition metal atoms may be W atoms, Mo atoms, or Ti atoms, and the group-VIA atoms may be S atoms, Se atoms, or Te atoms in accordance with some embodiments. Each of the transition metal atoms is bonded to four group-VIA atoms, and each of the group-VIA atoms is bonded to two transition metal atoms. The combination of one layer of transition metal atoms and two layers of the group-VIA atoms is referred to as a mono-layer of the TMD.

In accordance with some embodiments, the TMD layer 24-1 is deposited on isolation layer 22 using CVD, with $MoO_3$ powder and Se powder as precursors and $N_2$ as carrier gas. The flow rate of the each of the $MoO_3$ powder and Se powder may be in the range between about 5 sccm and about 100 sccm. In accordance with alternative embodiments, PECVD or another applicable method is used. The deposition temperature may be between about 750° C. and about 1,000° C. in accordance with some embodiments, and higher or lower temperatures may be used. The growth duration may be in the range between about 10 minutes and about 1 hour. The process conditions are controlled to achieve the desirable total count of mono-layers.

In accordance with alternative embodiments, the TMD layer 24-1 is formed on another substrate, and is then transferred onto isolation layer 22. For example, the TMD layer 24-1 may be deposited on a silicon oxide layer, which is further over another substrate such as a silicon substrate (not shown). The deposition may be achieved through CVD, followed by coating the resulting TMD layer 24-1 with a polymethyl methacrylate (PMMA) layer. The silicon oxide layer is then etched, for example, using a hot NaOH solution, so that the PMMA layer and the TMD layer 24-1 are detached from the silicon substrate. The PMMA layer and the TMD layer 24-1 are then adhered onto isolation layer 22. The PMMA layer is then removed, for example, in a wet etching process, leaving the TMD layer 24-1 on isolation layer 22.

Figure 3:
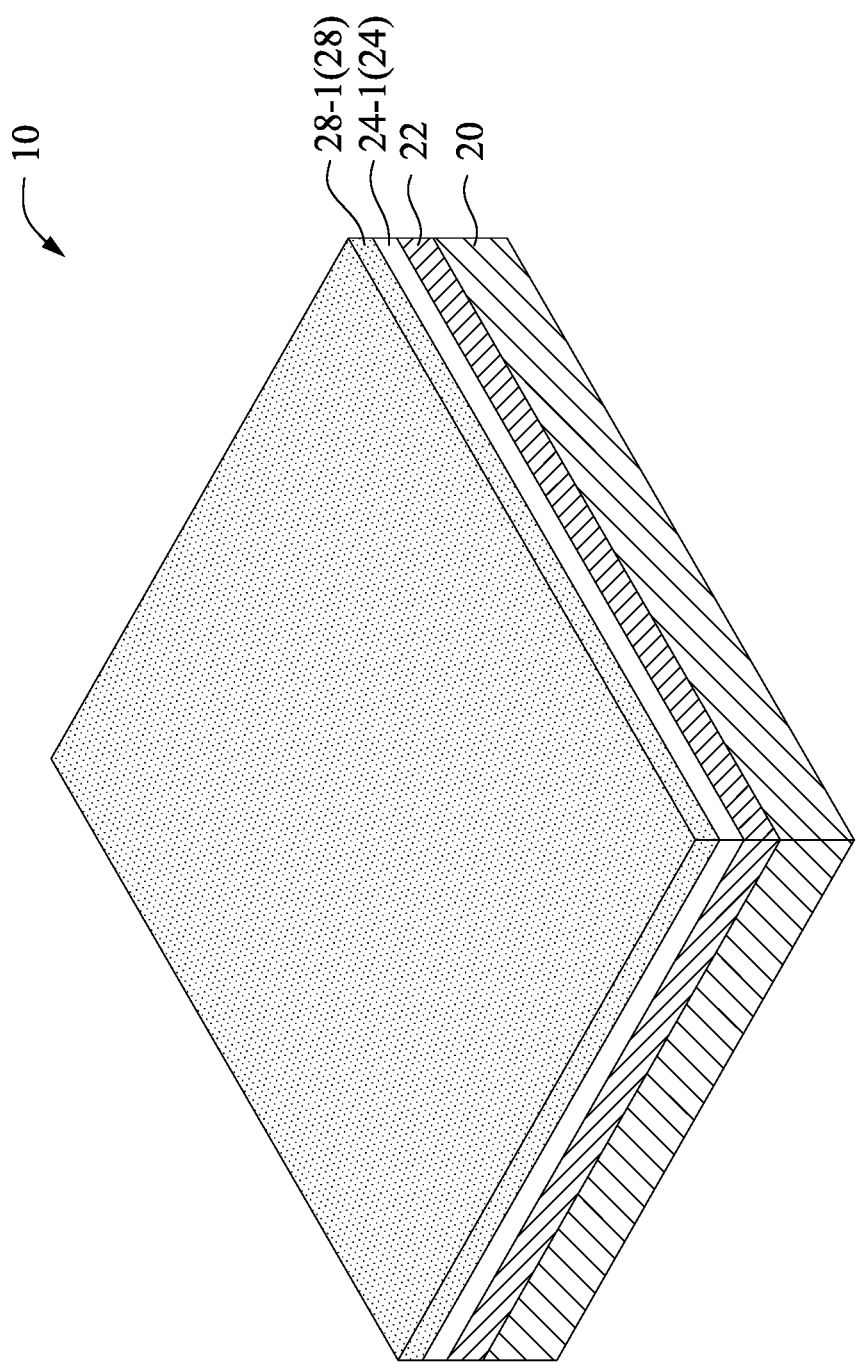

FIG. 3 illustrates the formation of insulator 28-1 (also denoted as 28). The respective process is illustrated as process 206 in the process flow 200 as shown in FIG. 16. In accordance with some embodiments of the present disclosure, insulator 28-1 is formed of or comprises an oxide such as silicon oxide, a nitride such as silicon nitride, hBN, a high-k dielectric material such as aluminum oxide, hafnium oxide, zirconium oxide, lanthanum oxide, or the like. Insulator 28-1 may be a crystalline layer (single crystalline or polycrystalline) or an amorphous layer. Insulator 28-1 may have a single-layer structure or a composite structure including a plurality of layers. For example, insulator 28-1 may have a bi-layer structure, a tri-layer structure, or the like. The bi-layer structure may include two layers formed of different materials, for example, a silicon oxide layer and a silicon nitride layer over the silicon oxide layer. The tri-layer structure may include three layers formed of different materials. For example, the tri-layer structure may have a $SiO_2$/SiN/$SiO_2$ structure, an $HfO_2$/$SiO_2$/$HfO_2$ structure, or the like. The formation process may include a deposition process(es), for example, a PECVD process, an ALD process, or the like. When low-dimensional layer 24-1 comprises carbon nanotube networks or aligned nanotubes, insulator 28-1 may fill the space between the nanotubes in low-dimensional layer 24-1, as shown in FIG. 6B. Insulator 28-1 may also be formed through transfer, for example, when insulator 28-1 is formed of or comprises hBN. In accordance with these embodiments, insulator 28-1 may be formed on another substrate, which may be a sapphire substrate or a copper substrate, and then transferred onto low-dimensional layer 24-1. The thickness of insulator 28-1 may be greater than about 0.5 nm, and may be in the range between about 0.5 nm and about 15 nm in accordance with some embodiments.

Figure 4:
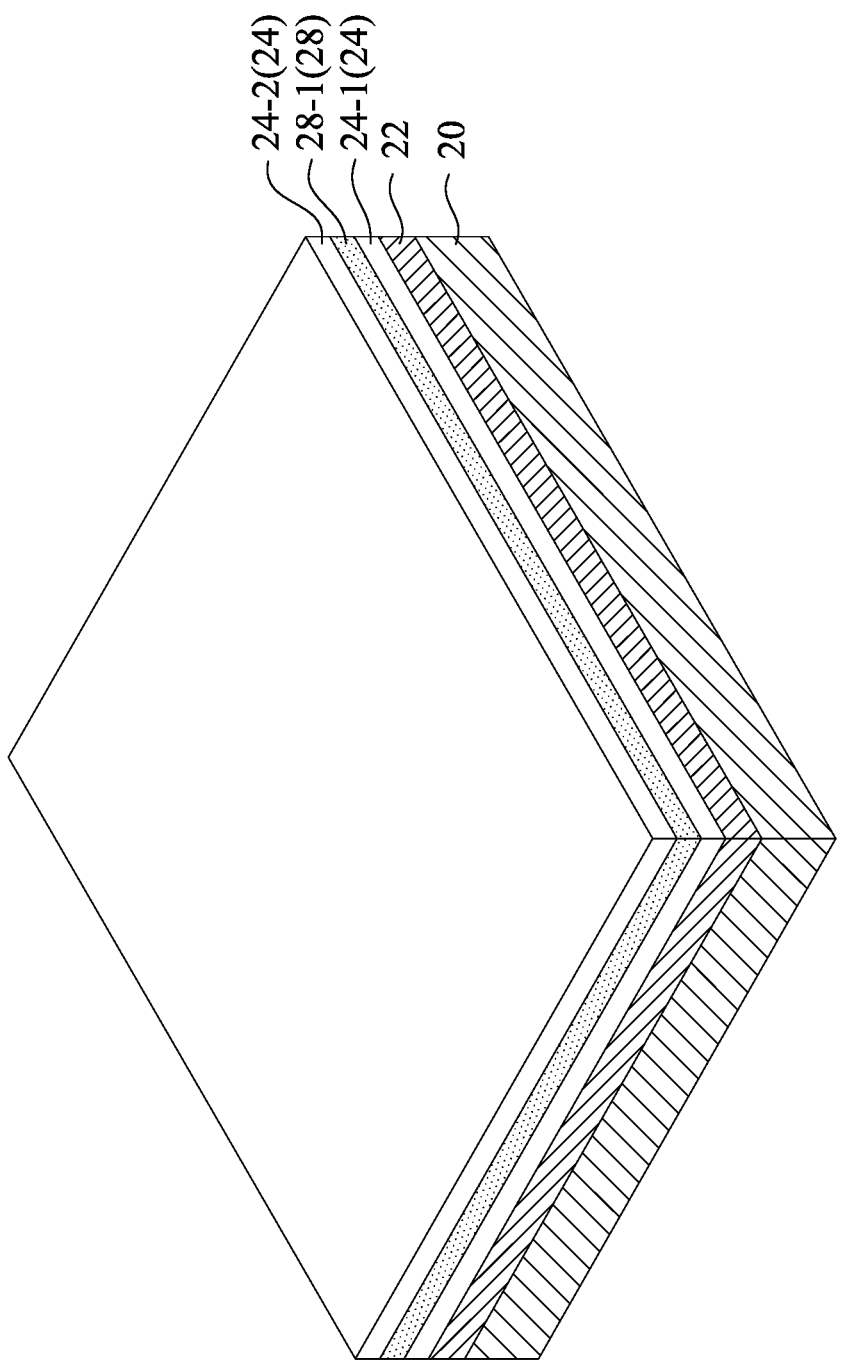

Referring to FIG. 4, low-dimensional layer 24-2 (also denoted as 24) is formed over insulator 28-1. The respective process is illustrated as process 208 in the process flow 200 as shown in FIG. 16. Low-dimensional layer 24-2 is formed of a material selected from the same group of candidate materials for forming low-dimensional layer 24-1. For example, low-dimensional layer 24-2 may include carbon nanotube networks, aligned carbon nanotubes, a TMD layer, or the like. The thickness of low-dimensional layer 24-2 may also be similar to that of low-dimensional layer 24-1, and may be in the range between about 0.5 nm and about 5 nm. The formation process of low-dimensional layer 24-2 may also be selected from the candidate processes for forming low-dimensional layer 24-1.

Low-dimensional layer 24-2 may be formed of a same type of low-dimensional material as low-dimensional layer 24-1, or may be formed of a different type of low-dimensional material than low-dimensional layer 24-1. For example, when low-dimensional layer 24-1 comprises carbon nanotube networks, low-dimensional layer 24-2 may comprise carbon nanotube networks, which are of the same type as low-dimensional layer 24-1. Conversely, when low-dimensional layer 24-1 comprises carbon nanotube networks, low-dimensional layer 24-2 may comprise aligned carbon nanotubes or a TMD layer, which is different from that of low-dimensional layer 24-1. Having low-dimensional layers 24-1 and 24-2 formed of the same type of low-dimensional material may reduce the manufacturing cost. On the other hand, having low-dimensional layers 24-1 and 24-2 formed of different types of low-dimensional materials may even-out process variations and improve the device uniformity throughout wafer 10.

Figure 5:
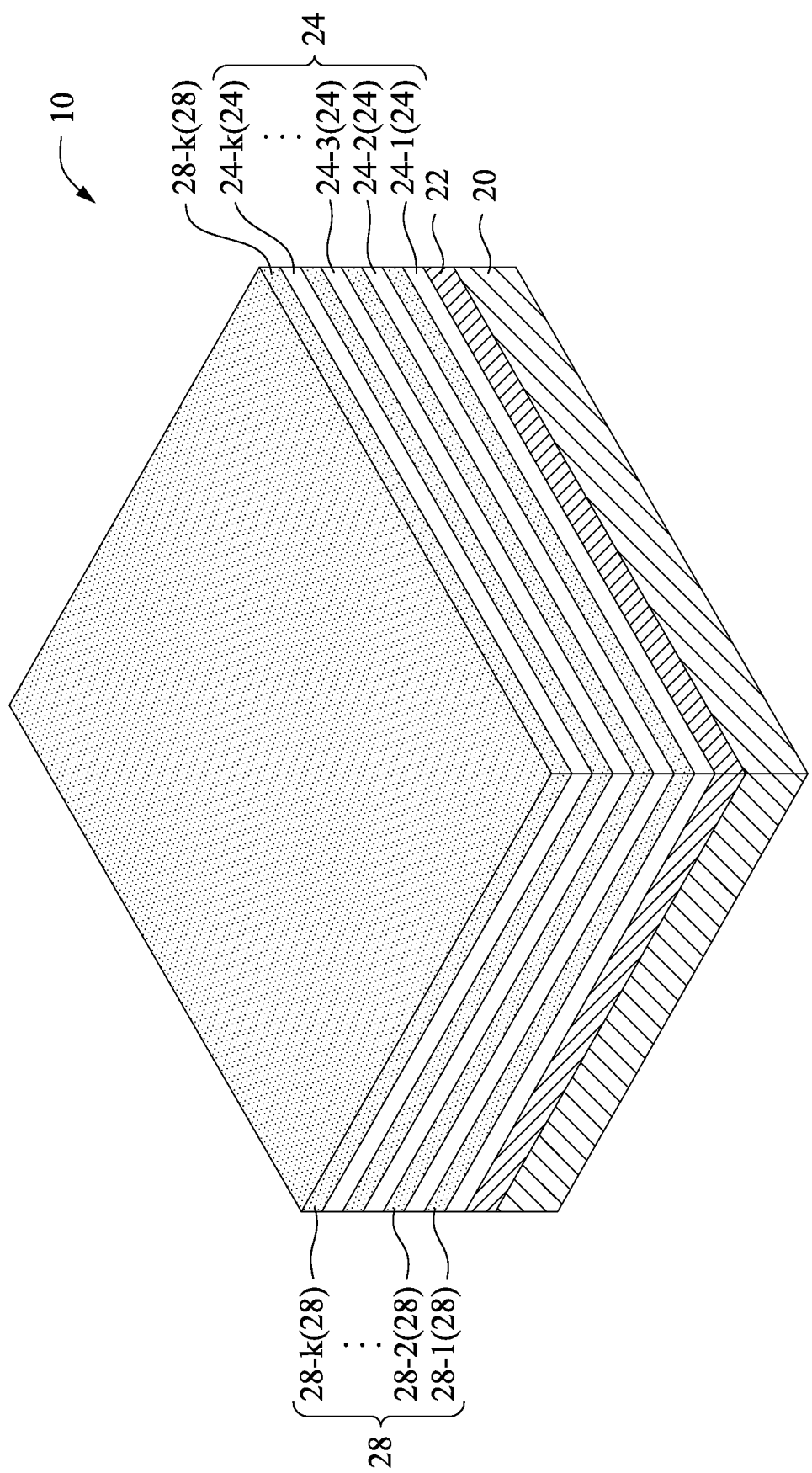

Referring to FIG. 5, insulator 28-2 (also denoted as 28) is formed over low-dimensional layer 24-2. The respective process is illustrated as process 210 in the process flow 200 as shown in FIG. 16. Insulator 28-2 may be formed of a material selected from the same group of candidate materials for forming insulator 28-1. For example, insulator 28-2 may be formed of silicon oxide, a high-k dielectric material, hBN, or may have a composite structure. Insulators 28-1 and 28-2 may also be formed of a same dielectric material or different dielectric materials. The thickness of insulator 28-2 may also be similar to that of insulator 28-1, and may be in the range between about 0.5 nm and about 15 nm. The formation process of insulator 28-2 may also be selected from the candidate processes for forming insulator 28-1, and may include a deposition process such as CVD, ALD, PECVD, a transfer process, or the like.

FIG. 5 further illustrates the formation of a plurality of low-dimensional layers and a plurality of insulators, which are formed alternatingly. For example, the low-dimensional layers include 24-3 through 24-$k$, and the insulators include 28-3 through 28-$k$, wherein k represents an integer equal to or greater than 4. It is appreciated that the stacked layers may also include two or three alternating layers, which means that the number k is equal to 2 or 3. Low-dimensional layers 24-3 through 24-$k$ may be formed of a material selected from the same group of candidate materials for forming low-dimensional layer 24-1. The materials of any two of low-dimensional layers 24-1 through 24-$k$ may be the same or different from each other. Insulators 28-3 through 28-$k$ may be formed of a material selected from the same group of candidate materials as the material for forming insulator 28-1. The materials of any two of insulators 28-1 through 28-$k$ may be the same or different from each other. The thicknesses and the formation methods of low-dimensional layers 24-3 through 24-$k$ and insulators 28-3 through 28-$k$ may also be similar to that of low-dimensional layer 24-1 and insulator 28-1, respectively. The details are not repeated herein. Throughout the description, low-dimensional layers 24-1 through 24-$k$ are collectively and individually referred to as low-dimensional layers 24, and insulators 28-1 through 28-$k$ are collectively and individually referred to as insulators 28.

Referring to FIG. 6A, a patterning process is performed to pattern low-dimensional layers 24 and insulators 28 into a protruding fin 32, which protrudes higher than isolation layer 22. The respective process is illustrated as process 212 in the process flow 200 as shown in FIG. 16. The remaining portions of low-dimensional layers 24 in protruding fin 32 are referred to as a low-dimensional strips 24-1' through 24-$k'$ hereinafter, which are collectively and individually referred to as low-dimensional strips 24'. The remaining portions of insulators 28-1 through 28-$k$ in protruding fin 32 are referred to as insulator strips 28-1' through 28-$k'$, which are collectively and individually referred to as insulator strips 28'. The widths W2 of protruding fin 32 is preferably small, so that the subsequently formed gate electrode may effectively control the channel materials (such as the carbon nanotubes) in the middle (between left edge and right edge) of each of low-dimensional strips 24-1' through 24-$k'$. In accordance with some embodiments, width W2 is smaller than about 8 nm, and may be in the range between about 2 nm and about 20 nm.

Figure 11:
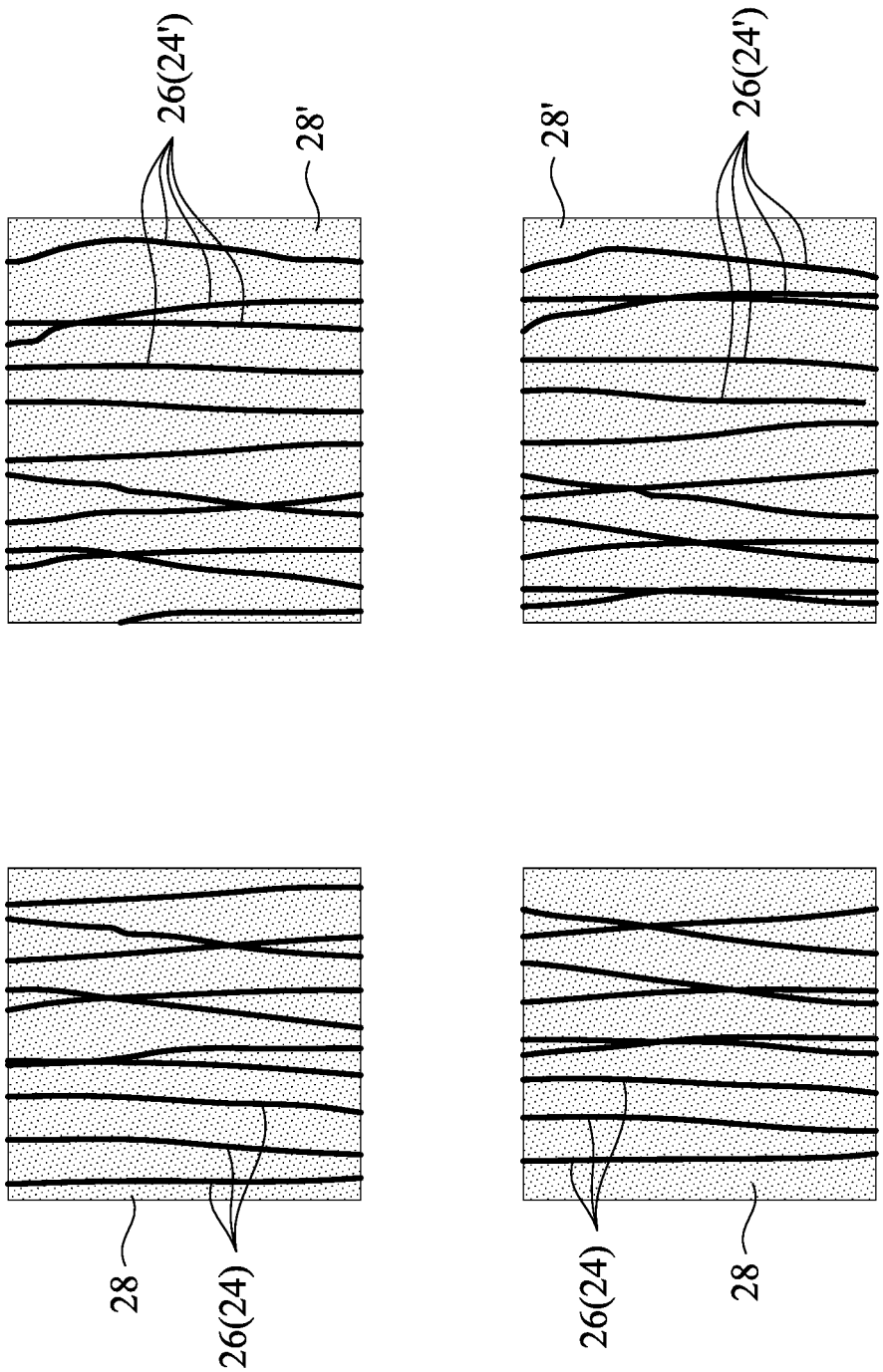
FIG. 11 illustrates a plane view of the patterned aligned carbon nanotubes and insulator in accordance with some embodiments.

FIG. 11 illustrates a plane view of one of low-dimensional strips 24' and insulator strips 28'. The carbon nanotubes 26, which collectively form low-dimensional strips 24', are also illustrated.

In accordance with some embodiments, the patterning process includes selecting appropriate etching gases to etch low-dimensional layers 24 and insulators 28 alternatingly. For example, when low-dimensional layers 24 comprise carbon nanotube networks, an oxygen-based etching gas such as $O_2$, $O_3$, or combinations thereof may be used. Inert gases such as argon may also be added to introduce some bombarding effect. When insulators 28 comprises silicon oxide, the patterning of insulators 28 may be performed using a mixture of $NF_3$ and $NH_3$ gases, or a mixture of HF and $NH_3$ gases. When insulators 28 comprise silicon nitride, the patterning of insulators 28 may be performed using a fluorine-containing gas such as a mixture of $CF_4$, $O_2$, and $N_2$, a mixture of $NF_3$ and $O_2$, $SF_6$, a mixture of $SF_6$ and $O_2$, or combinations thereof. In accordance with some embodiments in which catalyst strips 30 (FIG. 10A) remain at the time of patterning, catalyst strips 30 are also etched by selecting an appropriate etching gas.

FIG. 6B illustrates a cross-sectional view of protruding fin 32, which includes the carbon nanotubes 26 (which are collectively referred to the low-dimensional strips 24') in carbon nanotube networks or aligned carbon nanotubes. In accordance with some embodiments, the insulator layers 28 (FIG. 5) are formed through deposition. Accordingly, insulator strips 28' may fill the spaces between carbon nanotubes 26. Alternatively stated, carbon nanotubes 26 are embedded in the corresponding insulator strips 28'. It is appreciated that in each layer of low-dimensional strips 24', there may be a single one or more than one layer of carbon nanotubes 26, which are embedded in the corresponding layer of insulator strips 28'.

Figure 6C:
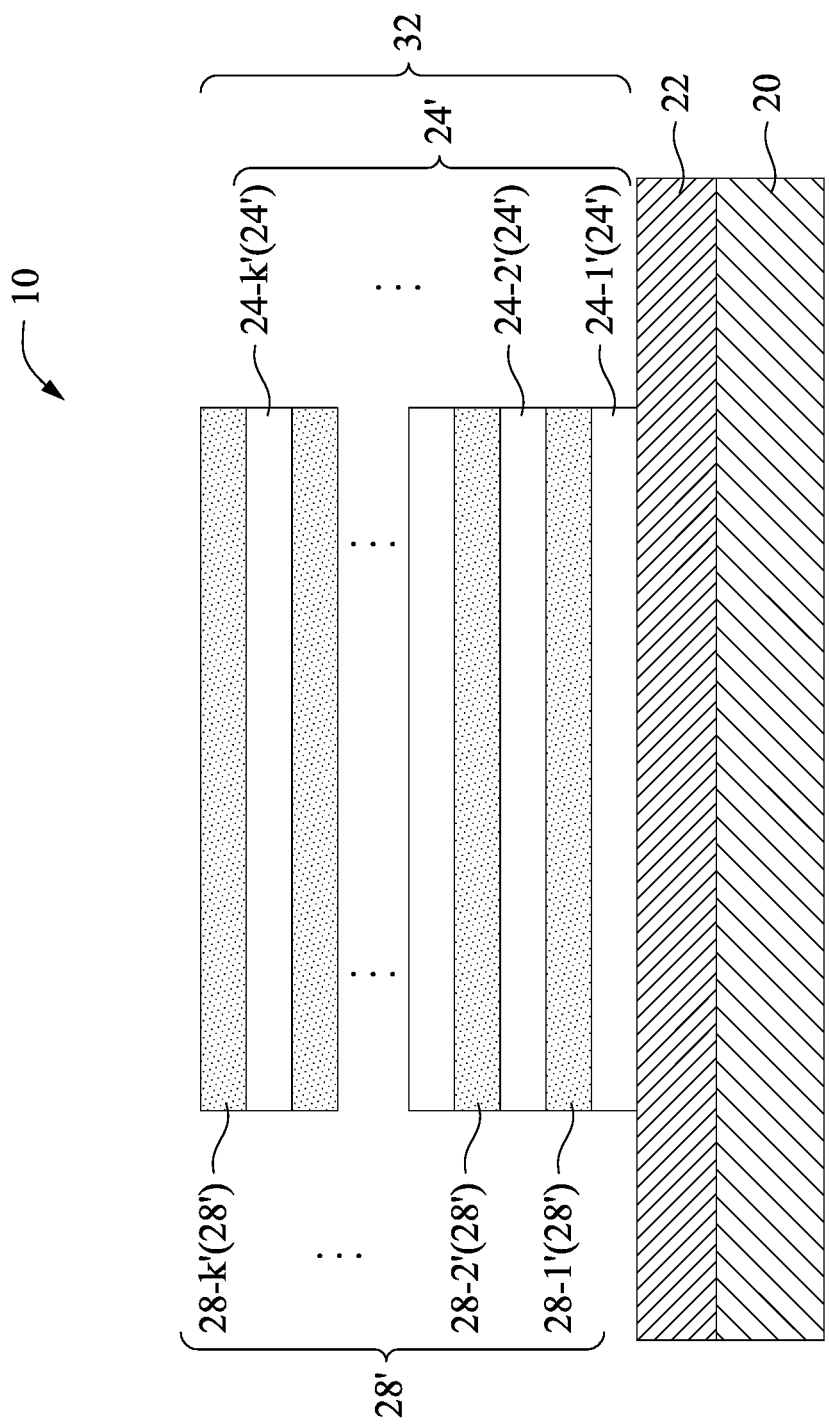

FIG. 6C illustrates a cross-sectional view of protruding fin 32, which includes TMD strips 24'. Each of the TMD strips 24' may have a uniform thickness.

The subsequent FIGS. 7A, 7B, 8, 9A and 9B illustrate the formation of more features of the transistor in accordance with some embodiment. The illustrated process is a gate-first process, in which the gate stack of the transistor is formed before the formation of source/drain regions of the transistor. In accordance with alternative embodiments, a gate-last process may be adopted, in which a dummy gate stack is formed, and is replaced with a replacement gate stack at a time after the formation of source/drain regions of the transistor.

Figure 7A:
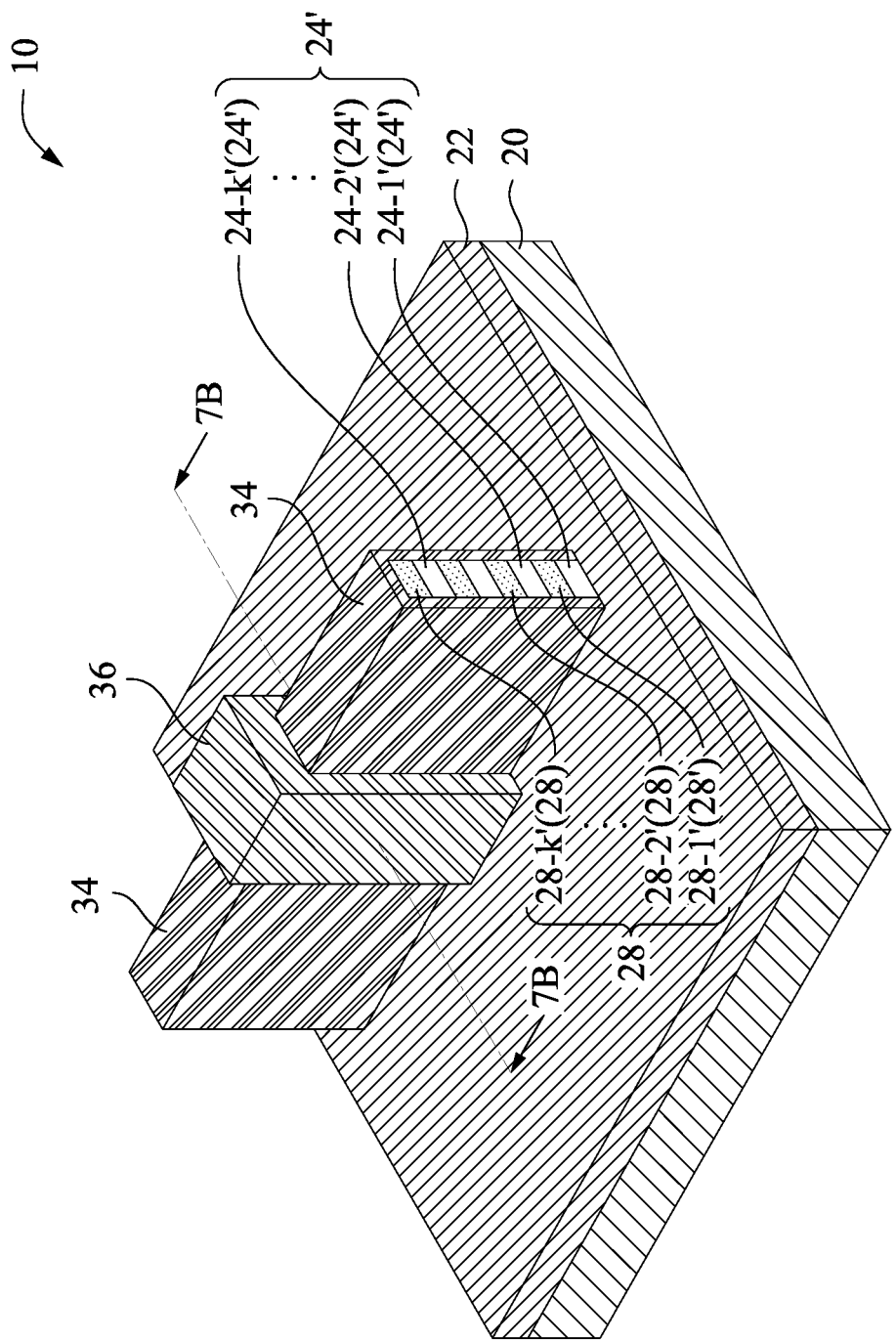

Referring to FIG. 7A, gate dielectric layer 34 is deposited. The respective process is illustrated as process 214 in the process flow 200 as shown in FIG. 16. In accordance with some embodiments, gate dielectric layer 34 comprises silicon oxide, a high-k dielectric material such as $HfO_2$, $ZrO_2$, HfZrOx, HfSiOx, HfSiON, ZrSiOx, HfZrSiOx, $Al_2O_3$, HfA-lOx, HfAlN, ZrAlOx, $La_2O_3$, $TiO_2$, $Yb_2O_3$, silicon nitride, or the like, or composite layers thereof. For example, gate dielectric layer 34 may include a silicon oxide layer and a high-k dielectric layer over the silicon oxide layer. Gate electrode 36 is formed over gate dielectric layer 34. The respective process is illustrated as process 216 in the process flow 200 as shown in FIG. 16. The formation process may include depositing a blanket gate electrode layer, and patterning the blanket gate electrode layer, leaving gate electrode 36 having portions on the sidewalls and over the top surface of protruding fin 32.

Figure 7B:
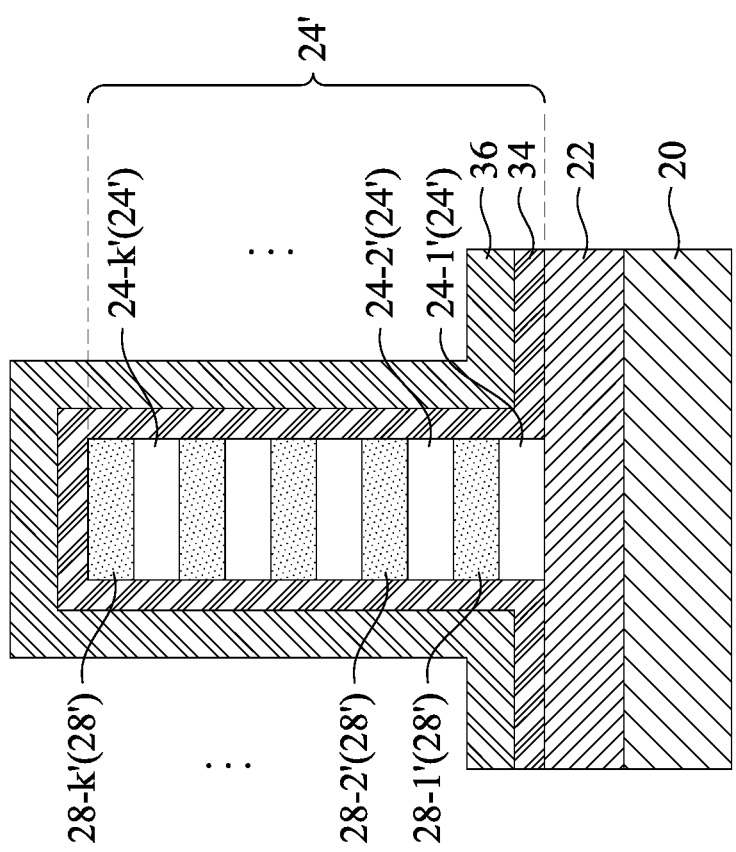

FIG. 7B illustrates a cross-sectional view of the structure shown in FIG. 7A, wherein the cross-sectional view is obtained from the reference cross-section 7B-7B in FIG. 7A. Gate dielectric layer 34 contacts the sidewalls of both of low-dimensional strips 24' and insulator strips 28'. The low-dimensional strips 24' act as the channel materials for conducting currents.

Figure 8:
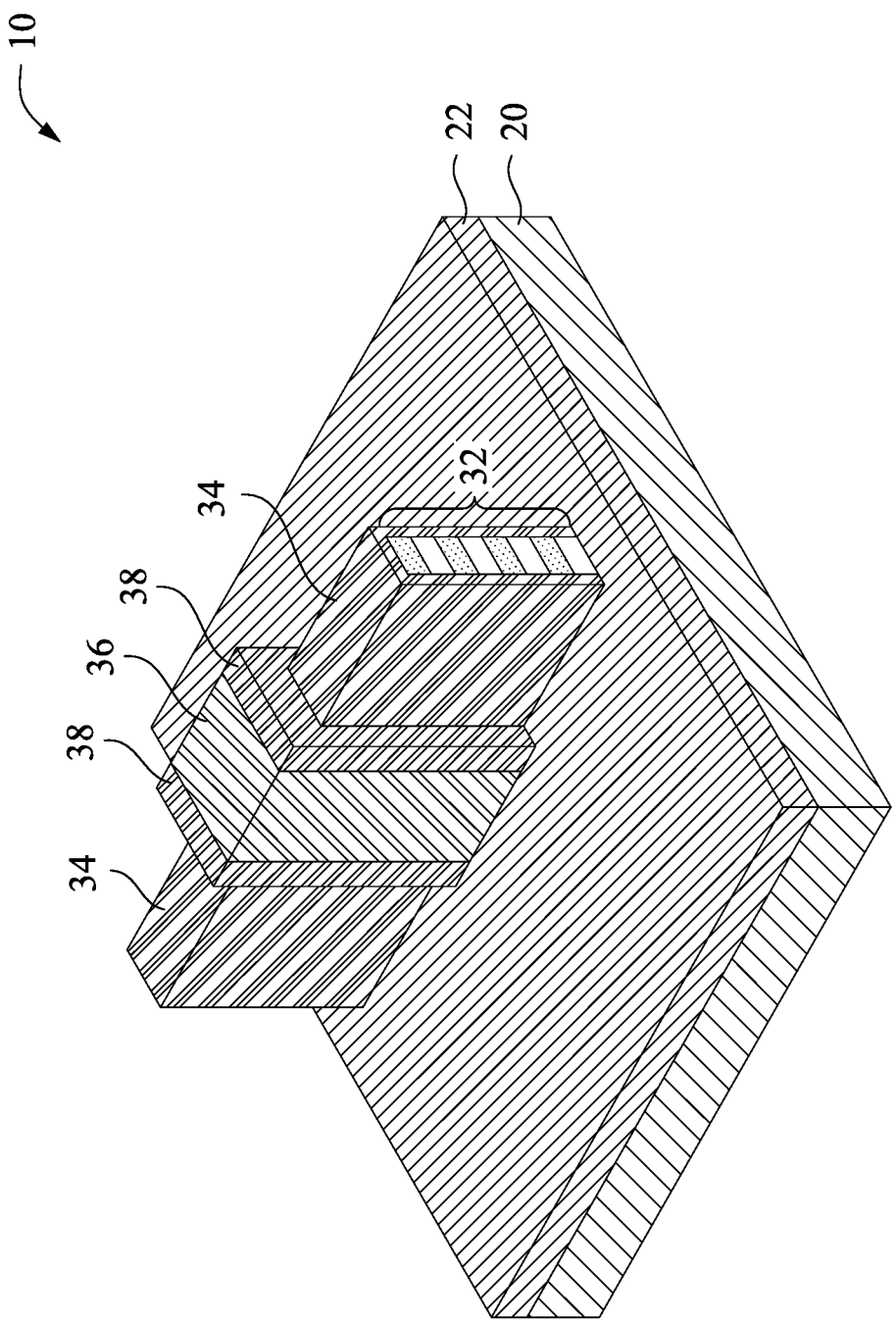

FIG. 8 illustrates the formation of gate spacers 38 in accordance with some embodiments. The respective process is illustrated as process 218 in the process flow 200 as shown in FIG. 16. In accordance with some embodiments of the present disclosure, gate spacers 38 are formed of a dielectric material such as silicon nitride, silicon oxide, silicon carbo-nitride, silicon oxynitride, silicon oxy carbo-nitride, or the like, and may have a single-layer structure or a multi-layer structure including a plurality of dielectric layers. It is appreciated that when protruding fin 32 is high, there may be fin spacers (not shown) on the sidewalls of protruding fins 32.

Figure 9A:
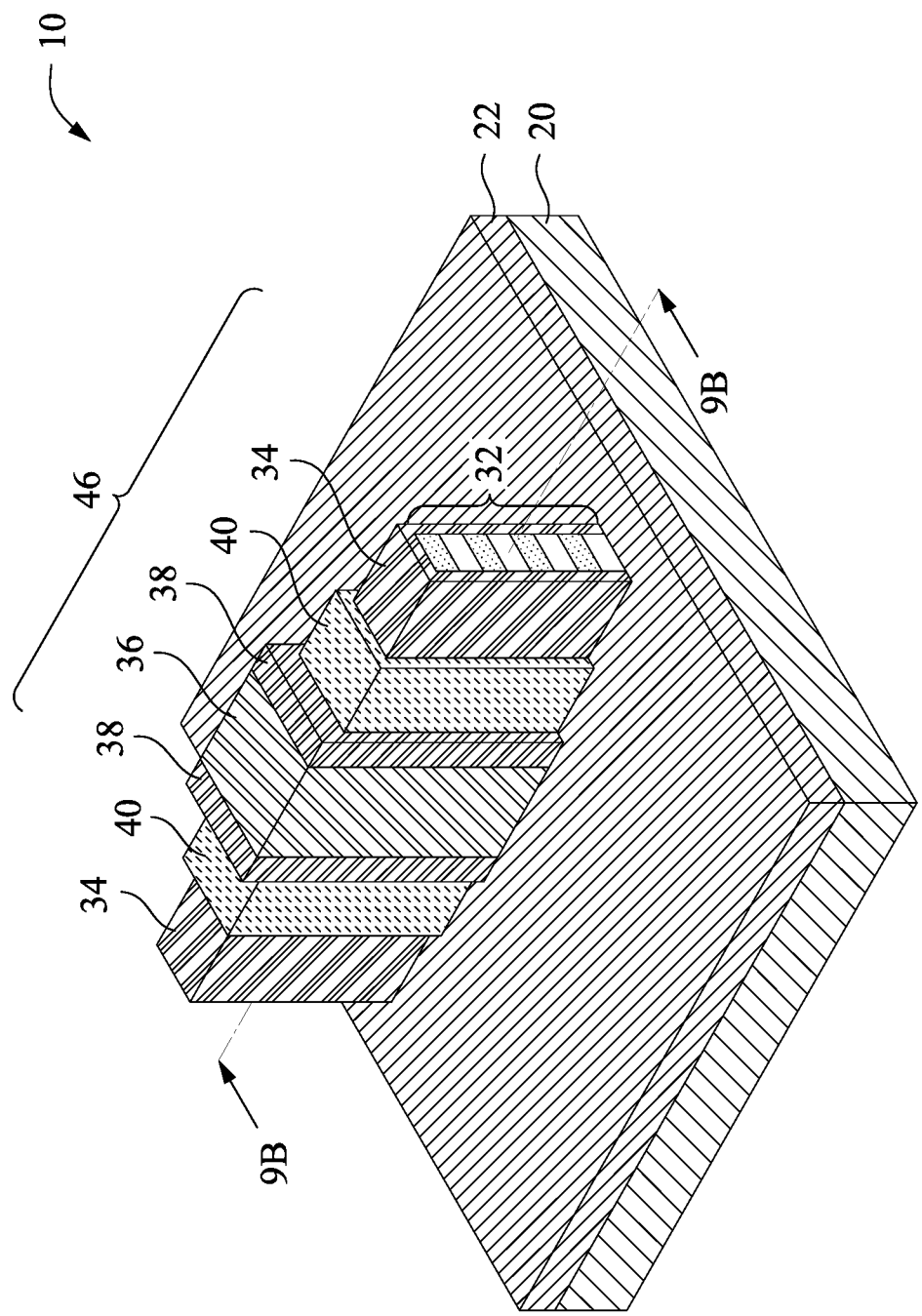
Figure 9B:
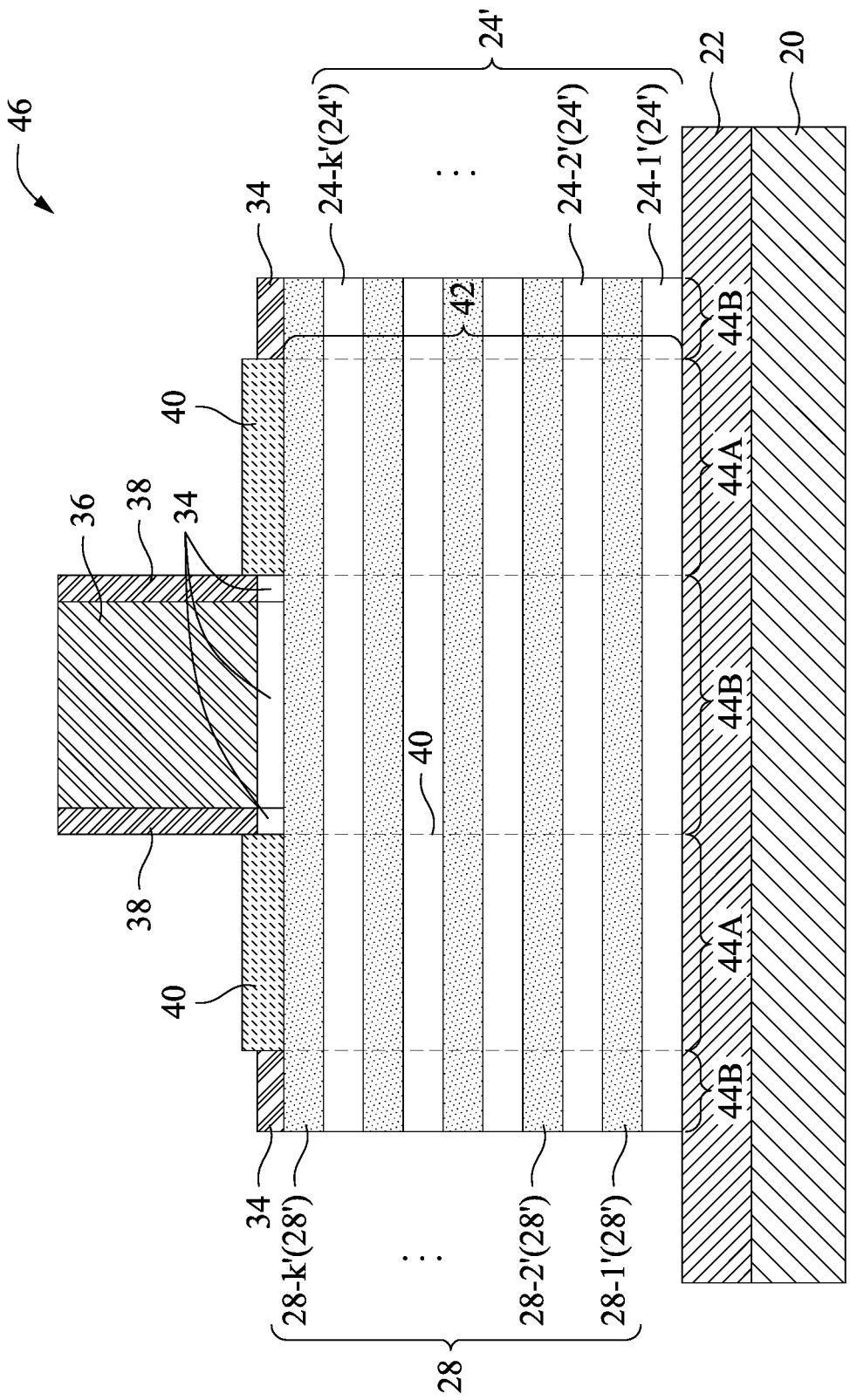

FIG. 9A illustrates the formation of source/drain contacts 40 in accordance with some embodiments. The respective process is illustrated as process 220 in the process flow 200 as shown in FIG. 16. In accordance with some embodiments in which low-dimensional strips 24' comprise carbon nanotube networks or TMD layers, side contacts may be adopted, wherein the parts of low-dimensional strips 24' on the opposite sides of gate electrode 36 act as the source/drain regions 42 (FIG. 9B), and the source/drain contacts 40 are in contact with the sidewalls of the source/drain regions 42. The source/drain regions 42 and source/drain contacts 40 are illustrated in FIG. 9B, which shows a cross-sectional view of the reference cross-section 9B-9B as in FIG. 9A. Transistor 46, which may be a FinFET, is thus formed.

In accordance with some embodiments, the formation of source/drain contacts 40 includes forming and patterning an etching mask such as a photo resist (not shown), so that the regions 44A (FIG. 9B) in which source/drain contacts 40 are to be formed are exposed, while other regions 44A are covered by the etching mask. The portions of gate dielectric layer 34 in regions 44A are exposed through the openings in the etching mask. Next, the exposed portions of gate dielectric layer 34 are removed in an etching process. If fin spacers are formed, since fin spacers may prevent the lower low-dimensional strips 24' from being in contact with source/drain contacts 40, the fins spacers are also etched, either in a same etching process as, or in an etching process different from, the etching process for etching gate dielectric layer 34. A conductive layer such as a metal layer (comprising tungsten, cobalt, or the like, for example) is then deposited as a blanket layer. A lift-off process is then performed, with the etching mask being lifted off, and the portions of the conductive layer on the etching mask are also removed, leaving source/drain contacts 40 as shown in FIGS. 9A and 9B.

Figure 12:
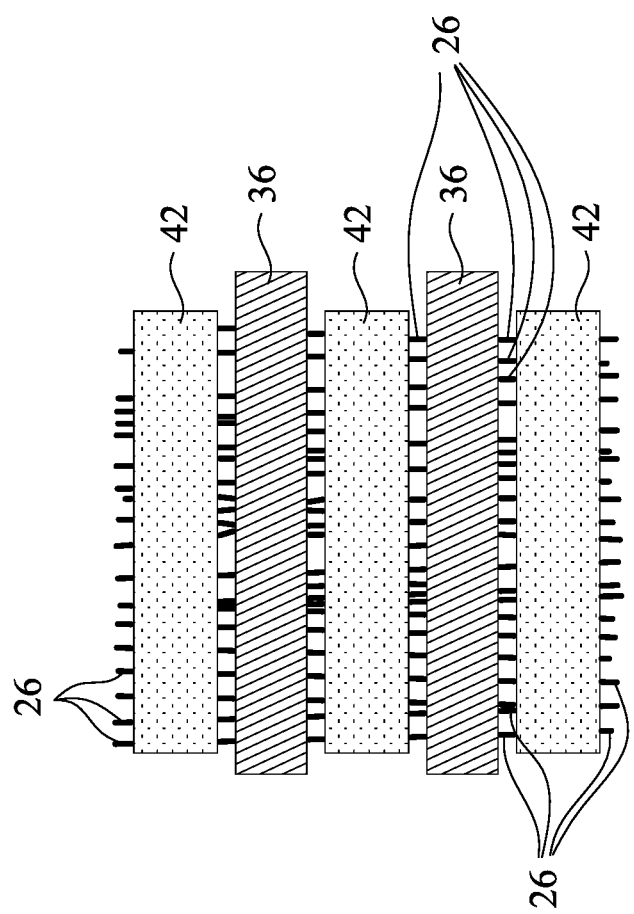
FIG. 12 illustrates the plane view of the gates and source/drain contacts of a transistor in accordance with some embodiments.

In accordance with alternative embodiments, for example, when aligned carbon nanotubes are formed, to ensure that all of the low-dimensional strips 24' in the source/drain regions 42 may contact source/drain contacts 40, a regrowth process is performed. In accordance with some embodiments, an etching mask is formed and patterned, and the portions of protruding fin 32 in regions 44A (FIG. 9B) are removed through etching to form recesses in protruding fin 32. A conductive material is then deposited into the resulting recesses. The conductive material may comprise a metal such as tungsten, cobalt or like. The conductive material thus forms the source/drain regions of the resulting transistor. FIG. 12 illustrates the resulting source/drain regions 42 and the carbon nanotubes 26 in accordance with some embodiments. In accordance with these embodiments, the source/drain regions 42 are connected to the ends, rather than sidewalls, of carbon nanotubes 26.

Figure 14:
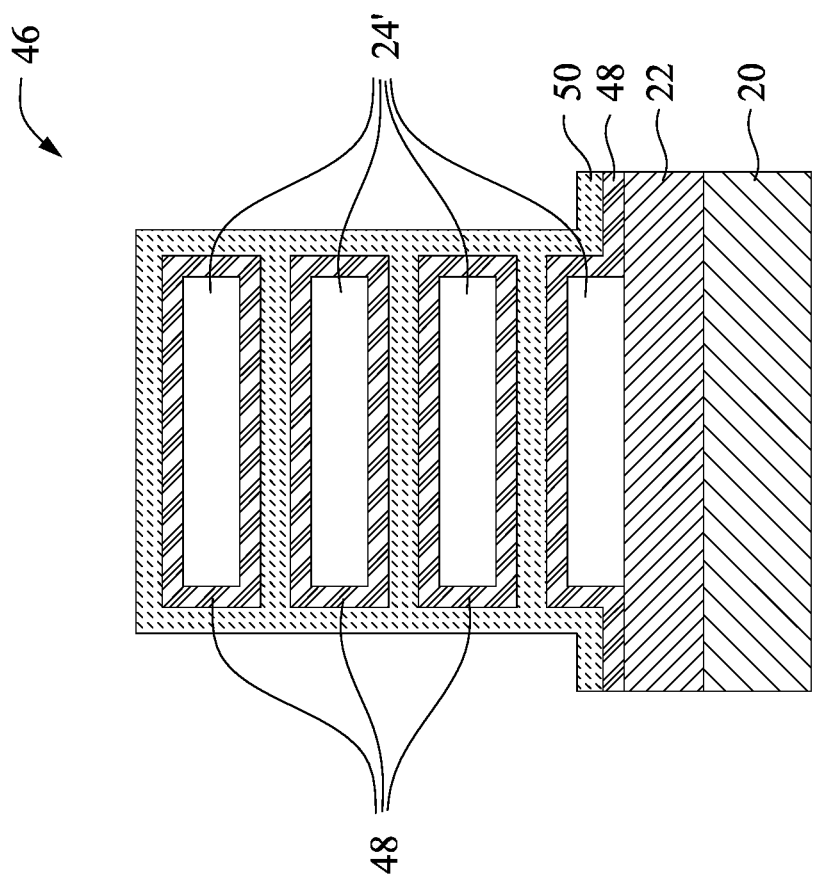
FIGS. 14 and 15 illustrate the cross-sectional views of channels and gate portions of gate-all-around transistors in accordance with some embodiments.
Figure 15:
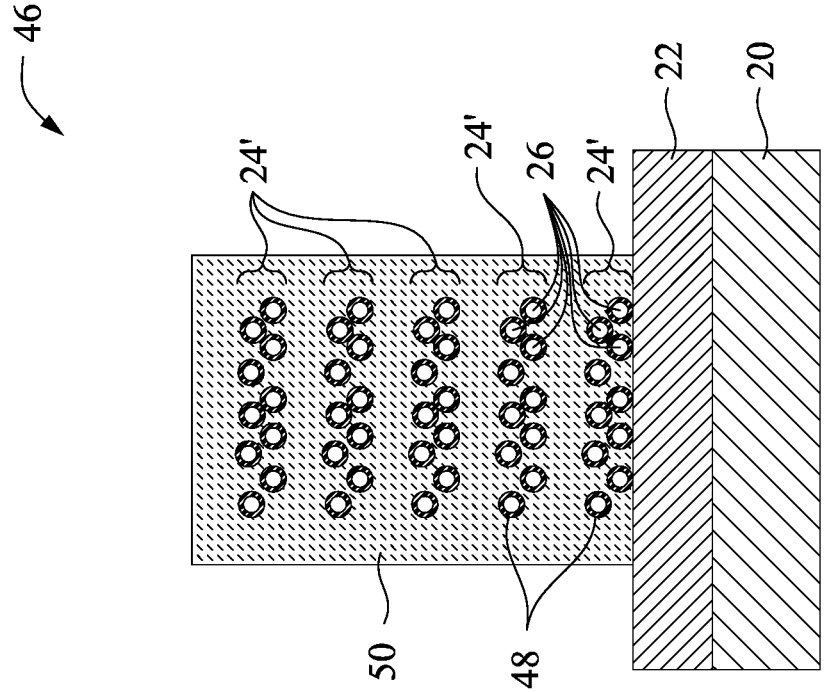

FIGS. 14 and 15 illustrate the cross-sectional views of channel and gate portions of some Gate-All-Around (GAA) transistors 46 in accordance with some embodiments. The cross-sectional views are obtained from the same reference cross-section as the cross-section 7B-7B as the in FIG. 7A. FIG. 14 illustrates a transistor whose low-dimensional strips 24' are TMD layers. In accordance with some embodiments, the formation processes include forming a dummy gate stack on protruding fin 32. After the formation of gate spacers 38 and source/drain contacts 40, a contact etch stop layer (CESL) and an inter-layer dielectric (not shown) are formed, so that the protruding fin 32, the gate spacers, and the source/drain contacts 42 are buried in the CESL and the ILD. The dummy gate stack is then removed, revealing the sidewalls of insulator strips 28' and low-dimensional strips 24'. The insulator strips 28' are then removed, leaving the low-dimensional strips 24'. A conformal deposition process is then performed to form replacement gate dielectric 48, followed by the formation of gate electrode 50, which may comprise one or a plurality of conductive layers.

FIG. 15 illustrates the GAA transistor including carbon nanotubes 26 (in carbon networks or aligned carbon nanotubes) as channels in accordance with some embodiments. The processes are similar to the embodiments as shown in FIG. 14, except that after the removal of insulator strips 28', carbon nanotubes 26, rather than solid sheets of low-dimensional strips 24', are left. Accordingly, replacement gate dielectric 48 is formed to encircle carbon nanotubes 26, and metal gate 50 fills the rest of the recesses.

The embodiments of the present disclosure have some advantageous features. The transistors in accordance with the embodiments of the present disclosure adopt low-dimensional materials as channel materials. The low-dimensional materials have high carrier mobility values and large energy bandgap values, and hence the resulting transistors have high currents. Also, the channel thickness is small due to the small thickness of the low-dimensional materials. Short-channel effect is thus reduced. The formation process is compatible with the current integrated circuit formation process on silicon substrates.

In accordance with some embodiments of the present disclosure, a method includes forming a first low-dimensional layer over an isolation layer, forming a first insulator over the first low-dimensional layer, forming a second low-dimensional layer over the first insulator, forming a second insulator over the second low-dimensional layer, and patterning the first low-dimensional layer, the first insulator, the second low-dimensional layer, and the second insulator into a protruding fin. Remaining portions of the first low-dimensional layer, the first insulator, the second low-dimensional layer, and the second insulator form a first low-dimensional strip, a first insulator strip, a second low-dimensional strip, and a second insulator strip, respectively. A transistor is then formed based on the protruding fin.

In accordance with some embodiments of the present disclosure, a device comprises a substrate; a first low-dimensional layer over the substrate; a second low-dimensional layer overlapping the first low-dimensional layer, wherein the second low-dimensional layer is vertically spaced apart from the first low-dimensional layer; a gate dielectric comprising a first top portion overlapping the first low-dimensional layer and the second low-dimensional layer; and sidewall portions on opposing sides of, and at same levels as, the first low-dimensional layer and the second low-dimensional layer; a gate electrode comprising a second top portion overlapping the first top portion of the gate dielectric; and a source/drain region on a side of, and electrically coupling to, the first low-dimensional layer and the second low-dimensional layer. In an embodiment, the gate dielectric comprises a middle portion between the first low-dimensional layer and the second low-dimensional layer. In an embodiment, the first low-dimensional layer and the second low-dimensional layer comprise carbon nanotube networks. In an embodiment, the first low-dimensional layer and the second low-dimensional layer comprise aligned carbon nanotubes. In an embodiment, the source/drain region comprises a metal, and contacts ends of the aligned carbon nanotubes. In an embodiment, the first low-dimensional layer and the second low-dimensional layer comprise TMD layer.

In accordance with some embodiments of the present disclosure, a device comprises an isolation layer; a first carbon nanotube layer over the isolation layer; a second carbon nanotube layer overlapping the first carbon nanotube layer, wherein the second carbon nanotube layer is vertically spaced apart from the first carbon nanotube layer; a gate dielectric comprising a top portion overlapping the second carbon nanotube layer; and sidewall portions on opposing sides of, and at same levels as, the first carbon nanotube layer and the second carbon nanotube layer; a gate electrode on the gate dielectric; and a source region and a drain region on opposing sides of the gate electrode, wherein the source region and the drain region are electrically connected to the first carbon nanotube layer and the second carbon nanotube layer. In an embodiment, the first carbon nanotube layer comprises carbon nanotubes. In an embodiment, the carbon nanotubes form a carbon nanotube network. In an embodiment, the carbon nanotubes form aligned carbon nanotubes. In an embodiment, the gate dielectric encircles the carbon nanotubes, with neighboring ones of the carbon nanotubes separated from each other by portions of the gate dielectric and the gate electrode. In an embodiment, the device further comprises an insulator overlapping the first carbon nanotube layer, wherein the insulator is further overlapped by the second carbon nanotube layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    depositing an isolation layer on a semiconductor substrate;
    forming a first low-dimensional layer over the isolation layer;
    forming a first insulator over the first low-dimensional layer;
    forming a second low-dimensional layer over the first insulator;
    forming a second insulator over the second low-dimensional layer;
    patterning the first low-dimensional layer, the first insulator, the second low-dimensional layer, and the second insulator into a protruding fin, with remaining portions of the first low-dimensional layer, the first insulator, the second low-dimensional layer, and the second insulator being a first low-dimensional strip, a first insulator strip, a second low-dimensional strip, and a second insulator strip, respectively;
    forming a transistor based on the protruding fin, wherein the forming the transistor comprises:
        forming a gate stack on a first portion of the protruding fin;
        etching a second portion of the protruding fin to form a recess, wherein the second portion is on a side of the first portion; and
        filling a metal into the recess to form a source/drain region.

2. The method of claim 1, wherein the forming the first low-dimensional layer comprises growing a carbon nanotube network through an immersion process.

3. The method of claim 1, wherein the forming the first low-dimensional layer comprises growing aligned carbon nanotubes, wherein the source/drain region contacts ends of the aligned carbon nanotubes.

4. The method of claim 3 further comprising:
    forming a catalyst strip, wherein the aligned carbon nanotubes are grown from the catalyst strip.

5. The method of claim 1, wherein the forming the first low-dimensional layer comprises depositing a Transition Metal Dichalcogenide (TMD) layer.

6. The method of claim 1, wherein the forming the transistor comprises:
    depositing a gate dielectric on a top surface and sidewalls of the protruding fin; and
    forming a gate electrode on the gate dielectric.

7. The method of claim 1, wherein the forming the transistor comprises:
    removing the first insulator and the second insulator; and
    depositing a gate dielectric, wherein the gate dielectric comprises:
        upper portions, each overlapping and in contact with a top surface of one of the first low-dimensional layer and the second low-dimensional layer; and
        lower portions, each overlapped by and in physical contact with a bottom surface of one of the first low-dimensional layer and the second low-dimensional layer.

8. The method of claim 1, wherein the isolation layer is in physical contact with the semiconductor substrate.

9. The method of claim 1, wherein the depositing the isolation layer comprises depositing a hexagonal boron nitride layer or a high-k dielectric layer.

10. A device comprising:
    a substrate;
    a first low-dimensional layer over the substrate;
    a second low-dimensional layer overlapping the first low-dimensional layer, wherein the first low-dimensional layer and the second low-dimensional layer comprise aligned carbon nanotubes, wherein the second low-dimensional layer is vertically spaced apart from the first low-dimensional layer;
    a gate dielectric comprising:
        a first top portion overlapping the first low-dimensional layer and the second low-dimensional layer; and
        sidewall portions contacting opposing sidewalls of the first low-dimensional layer and the second low-dimensional layer;
    a gate electrode comprising a second top portion overlapping the first top portion of the gate dielectric; and
    a source/drain region on a side of, and electrically coupling to, the first low-dimensional layer and the second low-dimensional layer, wherein the source/drain region comprises a metal, and the source/drain region contacts ends of the aligned carbon nanotubes.

11. The device of claim 10, wherein the gate dielectric comprises a middle portion between the first low-dimensional layer and the second low-dimensional layer.

12. The device of claim 10, wherein the first low-dimensional layer and the second low-dimensional layer comprise carbon nanotube networks.

13. The device of claim 10, wherein the source/drain region comprises tungsten or cobalt.

14. The device of claim 10, wherein the substrate is a semiconductor substrate, and the device further comprise active devices between the first low-dimensional layer and the substrate.

15. A device comprising:
- an isolation layer;
- a first carbon nanotube layer over the isolation layer;
- a second carbon nanotube layer overlapping the first carbon nanotube layer, wherein the second carbon nanotube layer is vertically spaced apart from the first carbon nanotube layer, and the first carbon nanotube layer and the second carbon nanotube layer comprise carbon nanotubes;
- a gate dielectric comprising:
  - a top portion overlapping the second carbon nanotube layer; and
  - sidewall portions on sidewalls of the first carbon nanotube layer and the second carbon nanotube layer;
- a gate electrode on the gate dielectric; and
- a source region and a drain region on opposing sides of the gate electrode, wherein the source region and the drain region comprise a metal, and the source region and the drain region are in physical contact with ends of the carbon nanotubes.

16. The device of claim 15, wherein the source region and the drain region comprise tungsten or cobalt.

17. The device of claim 16, wherein the carbon nanotubes form a carbon nanotube network.

18. The device of claim 16, wherein the carbon nanotubes form aligned carbon nanotubes.

19. The device of claim 16, wherein the gate dielectric encircles the carbon nanotubes, with neighboring ones of the carbon nanotubes separated from each other by portions of the gate dielectric and the gate electrode.

20. The device of claim 15 further comprising an insulator overlapping the first carbon nanotube layer, wherein the insulator is further overlapped by the second carbon nanotube layer.

* * * * *